(12) United States Patent
Sakai et al.

(10) Patent No.: US 11,115,608 B2
(45) Date of Patent: Sep. 7, 2021

(54) IMAGING DEVICE, IMAGING SYSTEM, AND DRIVE METHOD OF IMAGING DEVICE

(71) Applicant: CANON KABUSHIKI KAISHA, Tokyo (JP)

(72) Inventors: Seiichirou Sakai, Yokohama (JP); Hiroaki Kameyama, Kawasaki (JP); Kazuo Yamazaki, Yokohama (JP); Koichiro Iwata, Kawasaki (JP); Kohichi Nakamura, Kawasaki (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/826,614

(22) Filed: Mar. 23, 2020

(65) Prior Publication Data

US 2020/0314360 A1 Oct. 1, 2020

(30) Foreign Application Priority Data

Mar. 29, 2019 (JP) .............................. JP2019-066853

(51) Int. Cl.
*H04N 5/341* (2011.01)
*H03M 1/34* (2006.01)
*H04N 5/3745* (2011.01)
*H04N 5/378* (2011.01)
*H03M 1/56* (2006.01)

(52) U.S. Cl.
CPC .............. *H04N 5/341* (2013.01); *H03M 1/34* (2013.01); *H03M 1/56* (2013.01); *H04N 5/378* (2013.01); *H04N 5/3745* (2013.01)

(58) Field of Classification Search
CPC ..................................................... H04N 5/341
USPC ........................................................ 348/300
See application file for complete search history.

(56) References Cited

U.S. PATENT DOCUMENTS 9,294,699 B2 3/2016 Muto
2014/0175263 A1* 6/2014 Muto ..................... H04N 5/378
250/208.1

FOREIGN PATENT DOCUMENTS

JP 2014-140152 7/2014

* cited by examiner

*Primary Examiner* — Joel W Fosselman
(74) *Attorney, Agent, or Firm* — Venable LLP

(57) ABSTRACT

According to the present disclosure, column circuits operate selectively in a first drive mode to output a comparison signal or a second drive mode to acquire a correction value of a first reference signal and a second reference signal, and a selector circuit of a second column circuit selects the same reference signal out of the first reference signal and the second reference signal in the first drive mode and the second drive mode.

21 Claims, 14 Drawing Sheets

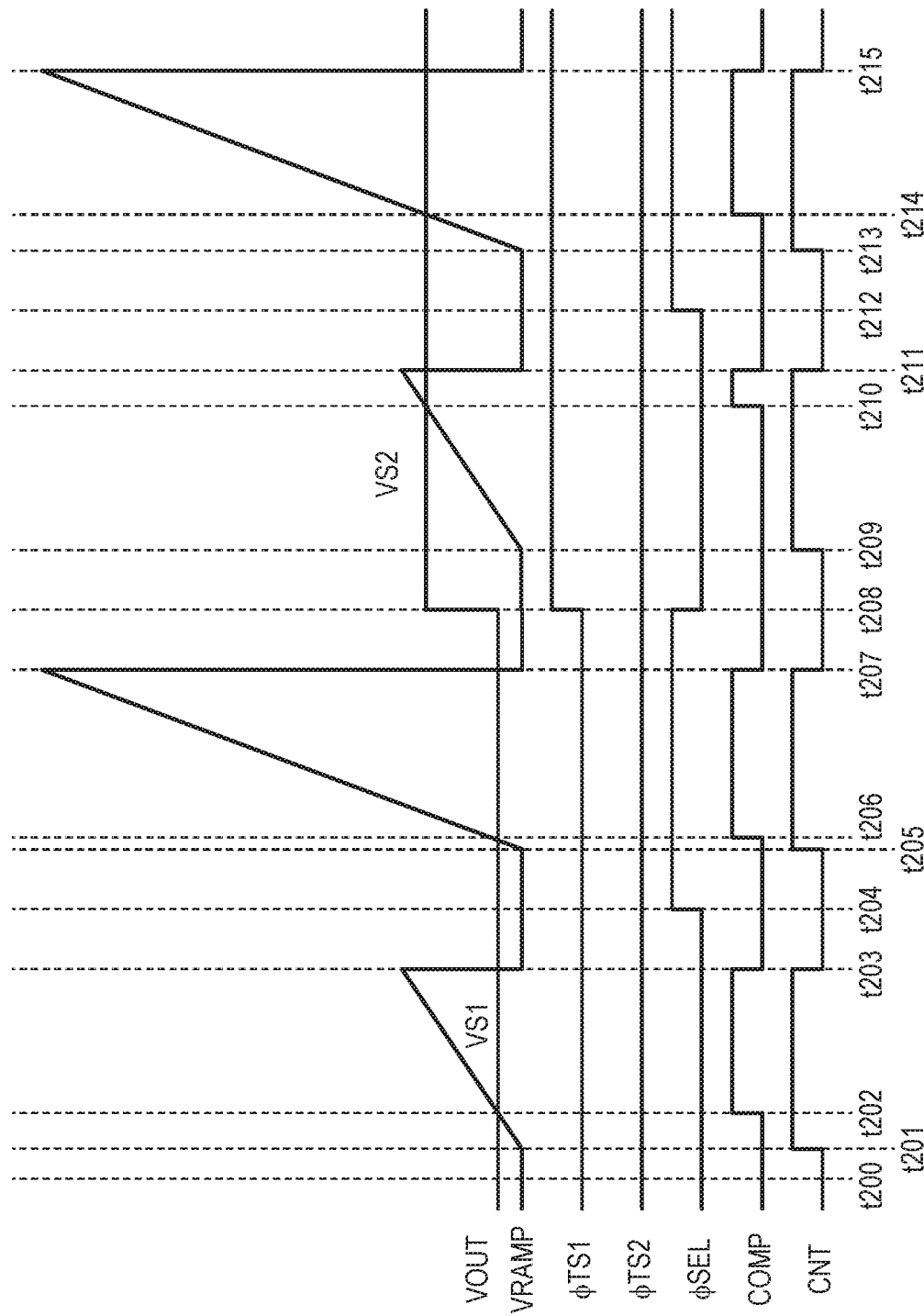

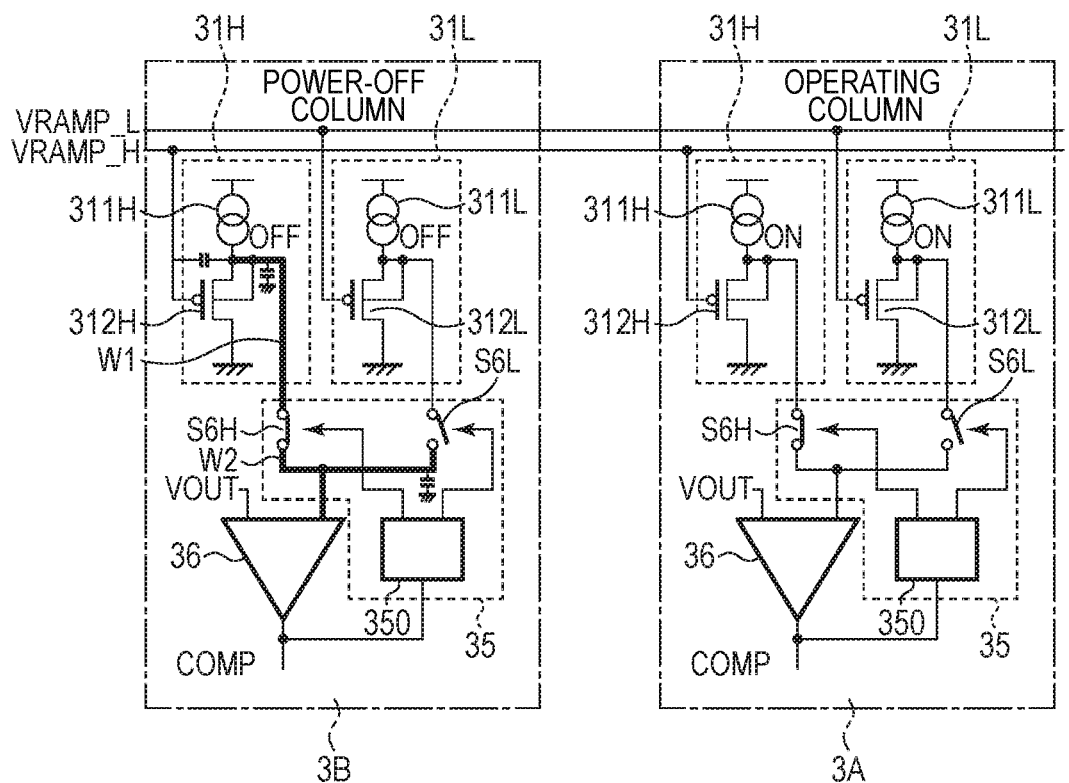
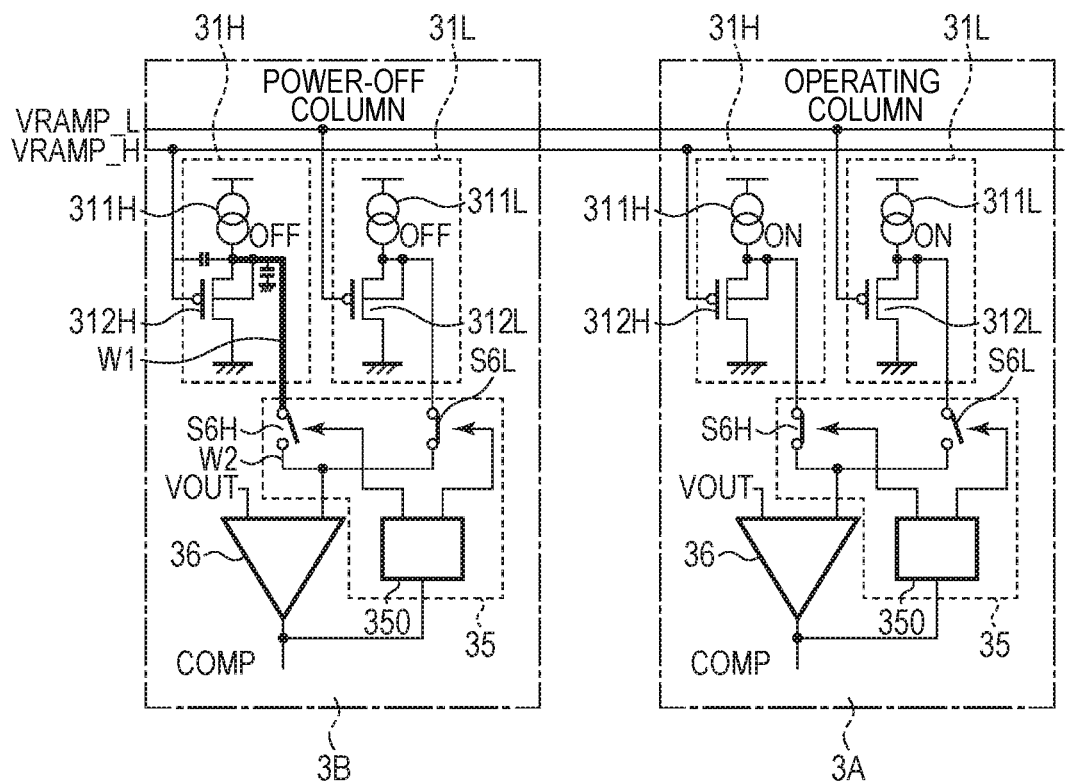

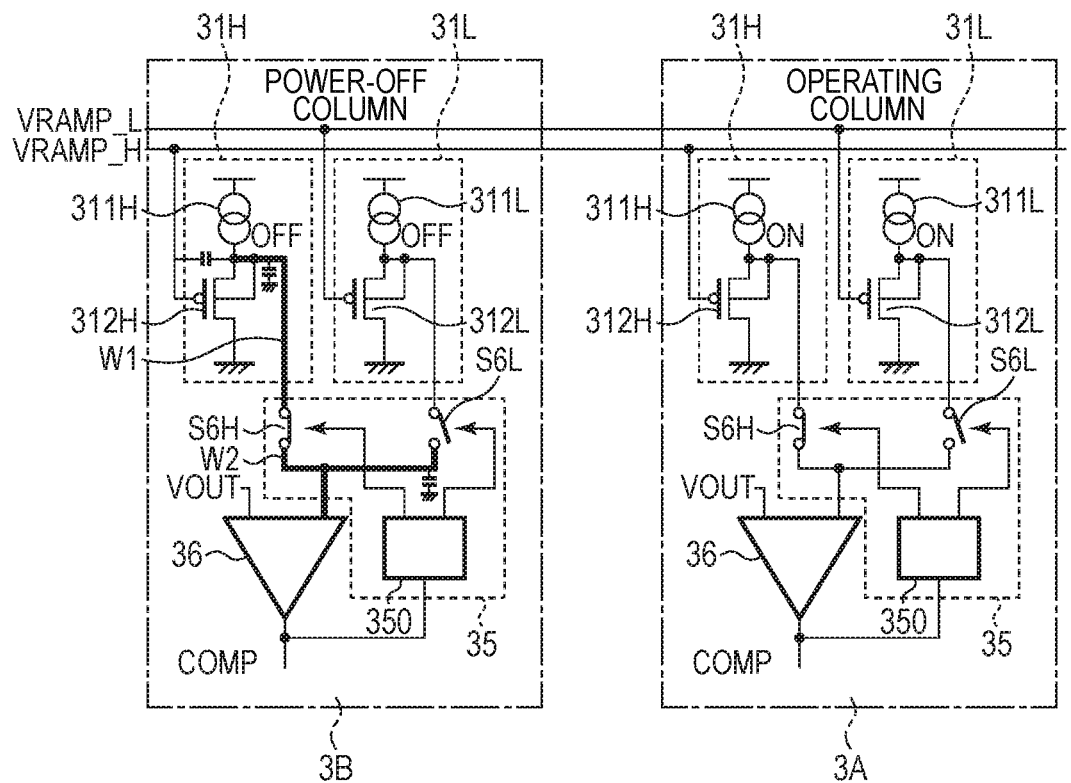
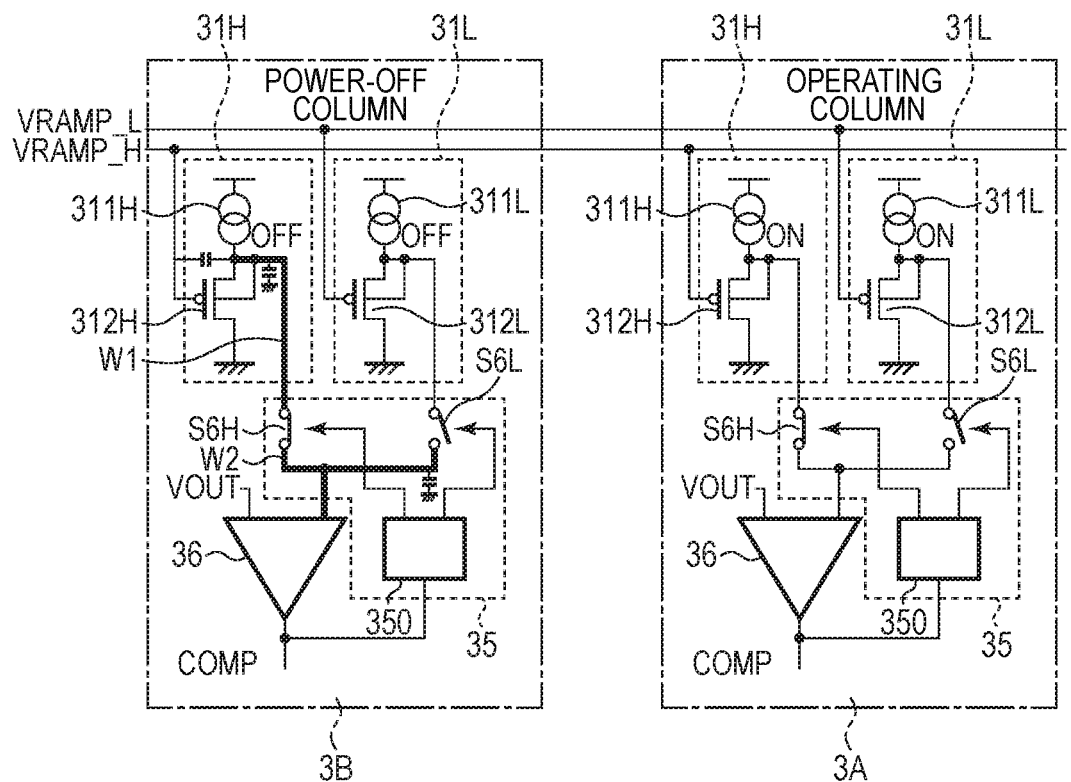

FIG. 10

| | (1) CORRECTION VALUE CALCULATION VRAMP_L USE | (2) CORRECTION VALUE CALCULATION VRAMP_H USE | (3) PIXEL SIGNAL READOUT LOW LUMINANCE | (4) PIXEL SIGNAL READOUT HIGH LUMINANCE |
|---|---|---|---|---|
| OPERATING COLUMN | VRAMP_L | VRAMP_H | VRAMP_L | VRAMP_H |
| POWER-OFF COLUMN | VRAMP_H | VRAMP_H | VRAMP_H | VRAMP_H |

FIG. 12

|  | (1) CORRECTION VALUE CALCULATION VRAMP_L USE | (2) CORRECTION VALUE CALCULATION VRAMP_H USE | (3) PIXEL SIGNAL READOUT LOW LUMINANCE | (4) PIXEL SIGNAL READOUT HIGH LUMINANCE |
|---|---|---|---|---|
| OPERATING COLUMN | VRAMP_L | VRAMP_H | VRAMP_L | VRAMP_H |
| POWER-OFF COLUMN | VRAMP_L | VRAMP_L | VRAMP_L | VRAMP_L |

IMAGING DEVICE, IMAGING SYSTEM, AND DRIVE METHOD OF IMAGING DEVICE

BACKGROUND OF THE INVENTION

Field of the Invention

The present invention relates to an imaging device, an imaging system, and a drive method of the imaging device.

Description of the Related Art

In recent years, imaging devices having analog-to-digital (AD) converter circuits have been used. Such an AD converter circuit is provided on each column of a pixel unit and outputs, as a digital signal, a count value obtained before the level relationship between a reference signal changing with time and a pixel signal is inverted. An imaging device disclosed in Japanese Patent Application Laid-Open No. 2014-140152 switches a first reference signal and a second reference signal having different changes per unit time (slopes) in accordance with an incident light amount. Further, the imaging device disclosed in Japanese Patent Application Laid-Open No. 2014-140152 supplies a test signal to an AD converter circuit at the time of correction value calculation and calculates (acquires) a correction value. At the time of readout, the imaging device corrects a digital signal so that digital signals converted by using the first and second reference signals are the same at the same incident light amount.

SUMMARY OF THE INVENTION

In the reference described above, wirings for the reference signals are differently connected at the time of correction value calculation and at the time of readout, this causes different parasitic capacitances coupled to the wirings for the reference signals, and the slopes of the reference signals may change. In particular, when AD converter circuits can be powered on or powered off on a column basis, the difference in the parasitic capacitance coupled to the wirings for the reference signals is likely to increase, and a correction error may increase.

An imaging device according to disclosure of the present specification includes: a pixel unit having a plurality of pixels that are arranged in a matrix and each output a pixel signal in accordance with a received light amount; a reference signal circuit that outputs a first reference signal and a second reference signal, wherein voltages of the first and second reference signals respectively change in dependent on time and a voltage change per unit time of the first reference signal is different from a voltage change per unit time of the second reference signal; and a plurality of column circuits each of which is provided on a corresponding column signal line of the pixel unit and includes a selector circuit that selects either the first reference signal or the second reference signal and a comparator that outputs a comparison signal indicating a result of comparison between the pixel signal and a reference signal selected by the selector circuit. The column circuits operate selectively in a first drive mode to output the comparison signal or a second drive mode to acquire a correction value of a ratio between the voltage change per unit time of the first reference signal and the voltage change per unit time of the second reference signal, the plurality of column circuits include a first column circuit that operates in the first drive mode and a second column circuit that is driven by a smaller current than a current of the first column circuit, and the selector circuit of the second column circuit selects the same reference signal out of the first reference signal and the second reference signal in the first drive mode and the second drive mode.

A drive method of an imaging device according to another disclosure of the present specification is a drive method of an imaging device including a pixel unit having a plurality of pixels that are arranged in a matrix and each output a pixel signal in accordance with a received light amount, a reference signal circuit that outputs a first reference signal and a second reference signal, wherein voltages of the first and second reference signals respectively change in dependent on time and a voltage change per unit time of the first reference signal is different from a voltage change per unit time of the second reference signal, and a plurality of column circuits each of which is provided on a corresponding column signal line of the pixel unit and includes a selector circuit that selects either the first reference signal or the second reference signal and a comparator that outputs a comparison signal indicating a result of comparison between the pixel signal and a reference signal selected by the selector circuit, and the plurality of column circuits includes a first column circuit that operates in a first drive mode and a second column circuit that is driven by a smaller current than a current of the first column circuit. The drive method includes: at the column circuits, operating selectively in the first drive mode to output the comparison signal or a second drive mode to acquire a correction value of a ratio between the voltage change per unit time of the first reference signal and the voltage change per unit time of the second reference signal; and at the selector circuit of the second column circuit, selecting the same reference signal out of the first reference signal and the second reference signal in the first drive mode and the second drive mode.

According to the present disclosure, it is possible to suppress variation in slopes of reference signals at the time of correction value calculation and at the time of readout and reduce a correction error.

Further features of the present invention will become apparent from the following description of exemplary embodiments with reference to the attached drawings.

BRIEF DESCRIPTION OF THE DRAWINGS

FIG. 7 is a timing chart at the time of correction value calculation in the imaging device of the first embodiment.

FIG. 8A is a diagram of a comparative example illustrating a slope correction error of a reference signal.

FIG. 8B is a diagram of the comparative example illustrating a slope correction error of a reference signal.

FIG. 9A is a diagram illustrating an operating column and a power-off column of the imaging device of the first embodiment.

FIG. 9B is a diagram illustrating an operating column and a power-off column of the imaging device of the first embodiment.

FIG. 10 is a diagram illustrating a selection state of a reference signal on an operating column and a power-off column in each of the time of correction value calculation and the time of pixel signal readout in the imaging device of the first embodiment.

FIG. 12 is a diagram illustrating a selection state of a reference signal on an operating column and a power-off column in each of the time of correction value calculation and the time of pixel signal readout in the imaging device of the second embodiment.

DESCRIPTION OF THE EMBODIMENTS

Embodiments of the present invention will be described below with reference to the drawings. The present invention is not limited to the embodiments described below. For example, a part of the configuration of any of the following embodiments may be added to another embodiment or may be replaced with a part of the configuration of another embodiment.

First Embodiment

Figure 1:
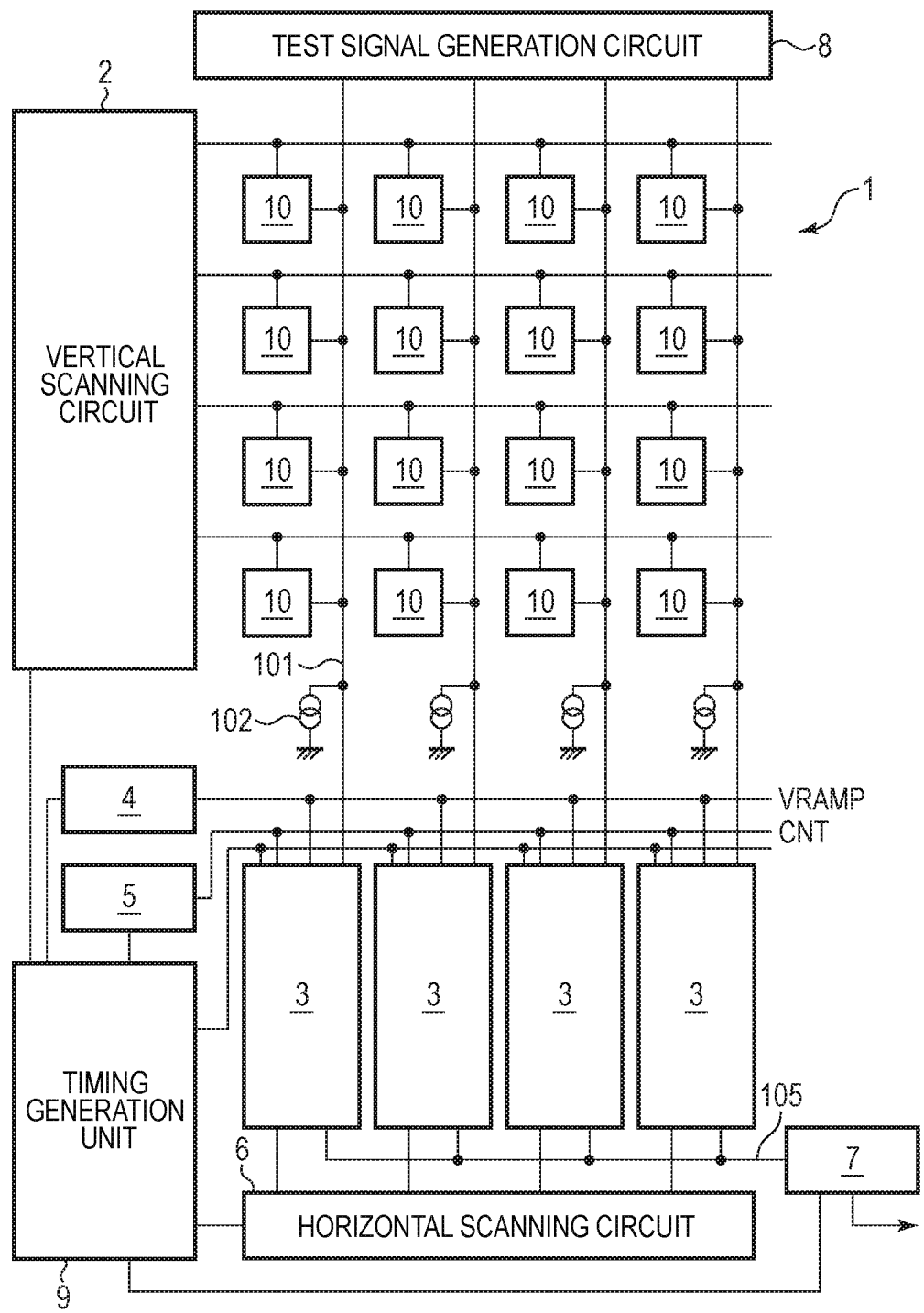
FIG. 1 is a block diagram of an imaging device of a first embodiment.

FIG. 1 is a block diagram of an imaging device of the present embodiment. The imaging device is a complementary metal oxide semiconductor (CMOS) image sensor, for example, and includes a pixel unit 1, a vertical scanning circuit 2, column circuits 3, a reference signal circuit 4, a counter circuit 5, a horizontal scanning circuit 6, a signal processing circuit 7, a test signal generation circuit 8, and a timing generation unit 9.

The pixel unit 1 includes a plurality of pixels 10 arranged in a matrix, and each of the pixels 10 includes a photoelectric conversion unit that generates and accumulates signal charges in accordance with a received light amount. Note that, in the present specification, the row direction represents the horizontal direction in the drawing, and the column direction represents the vertical direction in the drawing. A micro-lens and a color filter may be arranged on each pixel 10. The color filters are primary color filters of red, blue, and green, for example, and are provided on respective pixels 10 in accordance with the Bayer arrangement. Some pixels 10 are shielded from light as OB pixels (optical black pixels). In the plurality of pixels 10, a ranging row on which focus detection pixels that output pixel signals used for focus detection are arranged and a plurality of capturing rows on which capturing pixels that output pixel signals used for generating an image are arranged may be provided. The vertical scanning circuit 2 is formed of a shift register, a gate circuit, a buffer circuit, or the like and outputs control signals to the pixels 10 based on a vertical synchronization signal, a horizontal synchronization signal, a clock signal, or the like to drive the pixels 10 on a row basis. A column signal line 101 is provided on each column of the pixels 10, and the pixels 10 on the same column output pixel signals to the common column signal line 101. A current source 102 is provided on each column signal line 101 and functions as a load circuit of the pixels 10.

The column circuit 3 is provided on each column signal line 101 and converts a pixel signal (analog signal) on the column signal line 101 into a digital value (digital signal). As described later, the column circuit 3 includes an amplifier circuit that amplifies a pixel signal, a comparator that compares a reference signal with a pixel signal, and a memory unit that holds a comparison result and a count signal CNT.

The reference signal circuit 4 generates a reference signal (ramp signal) VRAMP whose voltage changes in dependent on time. The reference signal circuit 4 may be configured by using various schemes such as a capacitor charging/discharging scheme, a DAC scheme, a current steering scheme, or the like. The reference signal VRAMP may be a down-slope in which a voltage decreases with time without being limited to an up-slope in which a voltage increases with time. The reference signal VRAMP may include a first reference signal VRAMP_L and a second reference signal VRAMP_H. A voltage change per unit time of the reference signal VRAMP_L is smaller than a voltage change per unit time of the reference signal VRAMP_H.

The counter circuit 5 performs count-up or count-down of the count signal CNT by a counter in synchronization with the reference signal VRAMP. The counter circuit 5 starts counting of a clock pulse signal at the same time as start of voltage change of the reference signal VRAMP of the reference signal circuit 4 and outputs the count signal CNT. The count signal CNT is supplied to each column circuit 3.

The horizontal scanning circuit 6 includes a decoder or a shift register and sequentially reads out the count signal CNT held in the memory unit of the column circuit 3 as a digital signal to output the read out digital signal to signal processing circuit 7. The signal processing circuit 7 includes a digital signal processor and performs digital signal processing such as digital gain, digital correlated double sampling, digital offset, a linearity correction, or the like. Further, the signal processing circuit 7 includes a serial output circuit of a low voltage differential signaling (LVDS) scheme and outputs a digital signal on which signal processing has been performed to the outside of the solid state imaging device at a high speed and low power consumption.

The test signal generation circuit 8 includes a multiplexer and outputs a test signal of a predetermined voltage to each column signal line 101. The test signal is used to acquire a correction value of the slope of the reference signal VRAMP. Further, the test signal generation circuit 8 also has a function of outputting a clip voltage to each column signal line 101. Even when a high luminance light enters the pixel unit 1, it is possible to prevent the voltage on the column signal line 101 from changing (decreasing) and exceeding a clip voltage and suppress smear.

The timing generation unit 9 generates various control signals and drive signals based on a clock or a synchronization signal and controls the vertical scanning circuit 2, the column circuits 3, the reference signal circuit 4, the counter circuit 5, the horizontal scanning circuit 6, the signal processing circuit 7, and the test signal generation circuit 8.

Figure 2:
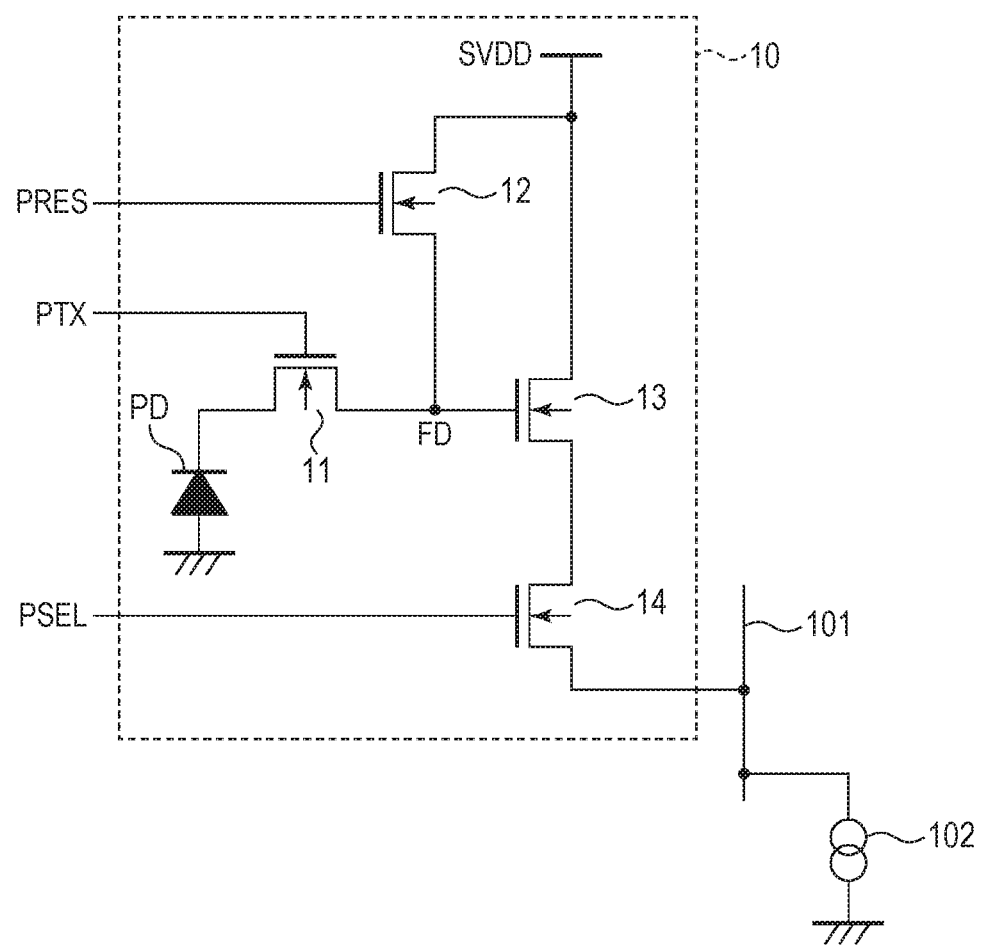
FIG. 2 is an equivalent circuit diagram of a pixel of the first embodiment.

FIG. 2 is an equivalent circuit diagram of the pixel 10 of the present embodiment. The pixel 10 includes a photoelectric conversion unit PD, a transfer transistor 11, a floating diffusion region FD, a reset transistor 12, an amplifier transistor 13, and a select transistor 14. In the following description, an example in which each transistor forming the pixel 10 is an N-channel MOS transistor will be illustrated. The photoelectric conversion unit PD is formed of a photodiode, for example, and performs photoelectric conversion caused by an incident light and accumulation of charges. Note that the photoelectric conversion unit PD may be any material that causes a photoelectric effect without being limited to a photodiode. The number of photoelectric conversion units PD per a pixel 10 is not limited, and two, four, or more photoelectric conversion units PD may be provided so as to share one micro-lens. Furthermore, when an embedded type photodiode is formed, dark current noise can be reduced. A micro-lens is provided over the photoelectric conversion unit PD, and a light converged by the micro-lens enters the photoelectric conversion unit PD.

The transfer transistor 11 is provided in association with the photoelectric conversion unit PD, and a control signal PTX is applied to the gate from the vertical scanning circuit 2. When the control signal PTX is controlled to the high level, the transfer transistor 11 is turned on (conductive state), and signal charges accumulated in the photoelectric conversion unit PD are transferred to the floating diffusion region FD formed in the gate of the amplifier transistor 13. Further, when the control signal PTX is controlled to the low level, the transfer transistor 11 is turned off (non-conductive state). The floating diffusion region FD converts signal charges into a voltage, and the amplifier transistor 13 outputs a signal voltage in accordance with the gate voltage from the source to the column signal line 101 via the select transistor 14. The drain of the amplifier transistor 13 is connected to a power source SVDD.

The source of the reset transistor 12 is connected to the floating diffusion region FD, the drain is connected to the power source SVDD, and a control signal PRES is applied to the gate from the vertical scanning circuit 2. When the control signal PRES is controlled to the high level, the reset transistor 12 is turned on, and the voltage of the power source SVDD is supplied to the floating diffusion region FD. The select transistor 14 is provided between the amplifier transistor 13 and the column signal line 101, and a control signal PSEL is applied to the gate of the select transistor 14 from the vertical scanning circuit 2. When the control signal PSEL is controlled to the high level, the amplifier transistor 13 and the column signal line 101 are electrically conducted. The current source 102 is electrically connected to the column signal line 101, and the current source 102 supplies a constant bias current to the source of the amplifier transistor 13 via the column signal line 101.

Figure 3:
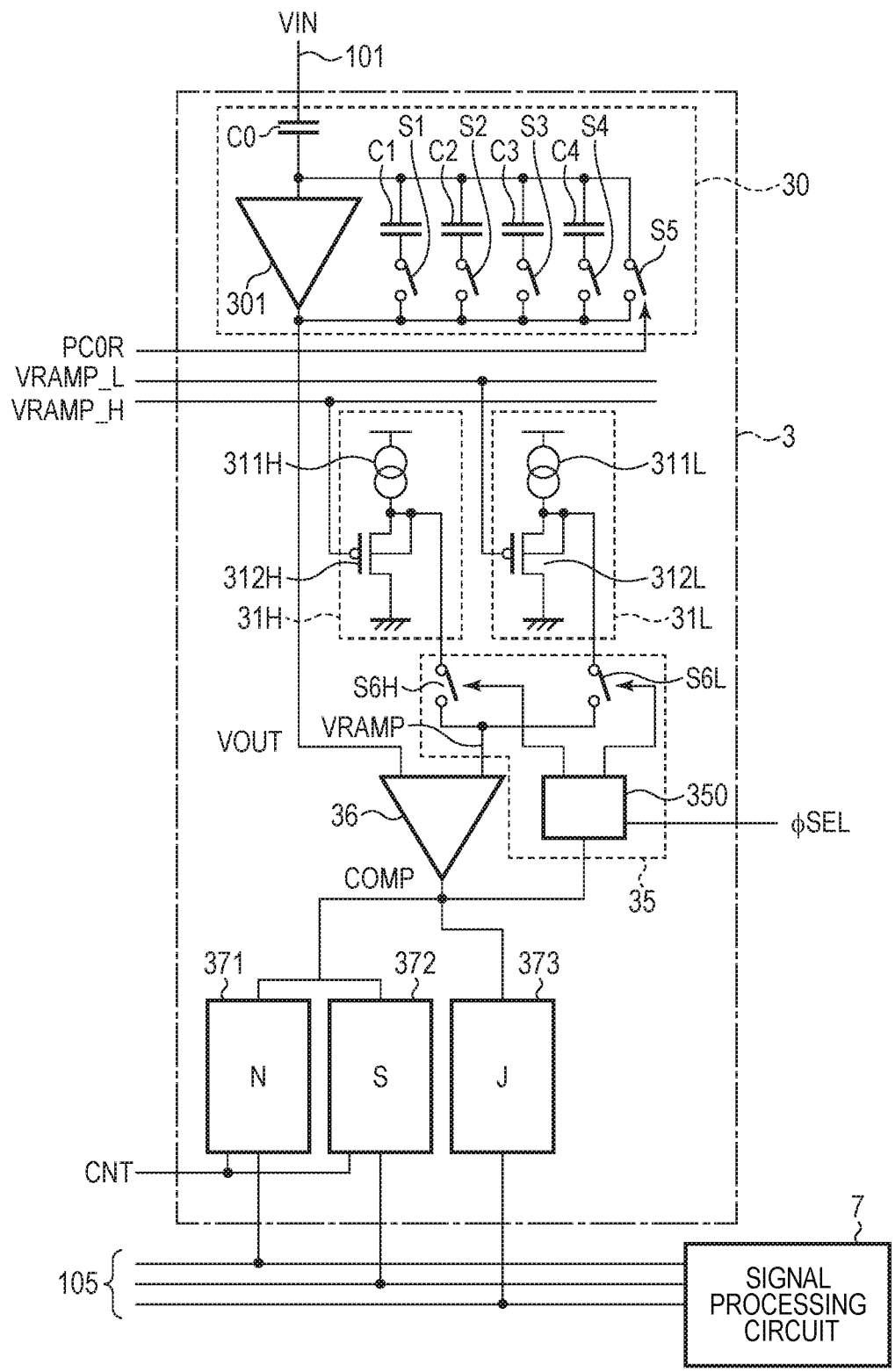
FIG. 3 is a block diagram of a column circuit of the first embodiment.

FIG. 3 is a block diagram of the column circuit 3 of the present embodiment. The column circuit 3 includes an amplifier circuit 30, source follower circuits 31H and 31L, a reference signal select unit 35, a comparator 36, and memories 371, 372, and 373.

The amplifier circuit 30 includes an amplifier 301, an input capacitor C0, feedback capacitors C1, C2, C3, and C4, and switches S1, S2, S3, S4, and S5. The amplifier 301 is formed of a differential amplifier circuit, an operational amplifier circuit, or the like and has an input node and an output node. The input node is connected to the column signal line 101 via the input capacitor C0, and the feedback capacitors C1, C2, C3, and C4 and the switches S1, S2, S3, S4, and S5 are connected between the input node and the output node. The feedback capacitors C1, C2, C3, and C4 are connected to the output node via the switches S1, S2, S3, and S4, respectively. Each of the switches S1, S2, S3, S4, and S5 is formed of a transistor, and a control signal from the timing generation unit 9 is applied to each gate thereof. By turning on or off the switches S1, S2, S3, or S4, it is possible to switch the gain of the amplifier circuit 30. The gain of the amplifier 301 is defined by a ratio between the input capacitor C0 and the feedback capacitors C1, C2, C3, and C4. For example, the gain is C1/C0 when the switch S1 is turned on, and the gain is (C2+C3)/C0 when the switches S2 and S3 are turned on. In such a way, the amplifier 301 amplifies a signal VIN of the column signal line 101 at a gain defined by the ratio between the input capacitor C0 and the feedback capacitors C1, C2, C3, and C4 and outputs a signal VOUT from the output node. The switch S5 is connected to the input node and the output node of the amplifier 301 and driven by a control signal PC0R. When the switch S5 is turned on, the feedback capacitors C1, C2, C3, and C4 are reset, and the signal VIN is clamped at the input capacitor C0.

The source follower circuit (second source follower circuit) 31H is a buffer circuit of the reference signal VRAMP_H and includes a current source 311H and a PMOS transistor 312H. The drain of the transistor 312H is connected to GND, and the back gate of the transistor 312H is connected to the source. The current source 311H is provided between the source of the transistor 312H and the power source. The current source 311H functions as a load circuit and a bias circuit of the transistor 312H. The current source 311H is formed of a transistor or the like and may be driven to be turned on or off by the timing generation unit 9. The reference signal VRAMP_H is input to the gate of the transistor 312H and output from the source at a gain of one-fold.

The source follower circuit (first source follower circuit) 31L is a buffer circuit of the reference signal VRAMP_L and includes a current source 311L and a PMOS transistor 312L. The source follower circuit 31L is configured in the same manner as the source follower circuit 31H.

The reference signal select unit 35 includes switches S6H and S6L and a selector circuit 350. The switch (second switch) S6H is provided between the source of the source follower circuit 31H and the first input node of the comparator 36. The switch (first switch) S6L is provided between the source of the source follower circuit 31L and the first input node of the comparator 36. Each of the switches S6H and S6L is formed of a transistor, and each gate is driven by the selector circuit 350. The selector circuit 350 can switch S6H and S6L to be turned on or off in accordance with a signal of the output node of the comparator 36. Further, a control signal φSEL is input from the timing generation unit 9 to the selector circuit 350. When the control signal φSEL is at the high level, the selector circuit 350 turns on the switch S6H and turns off the switch S6L to select the reference signal VRAMP_H. When the control signal φSEL is at the low level, the selector circuit 350 turns off the switch S6H and turns on the switch S6L to select the reference signal VRAMP_L. The control signal φSEL is used in a correction value calculation (acquisition) process described later.

The comparator 36 is formed of a differential amplifier circuit and has a first input node, a second input node, and an output node. The first input node is connected to the source follower circuits 31H and 31L via the reference signal select unit 35. Either the reference signal VRAMP_H or the reference signal VRAMP_L is input to the first input node. The signal VOUT from the amplifier circuit 30 is input to the second input node. The comparator 36 outputs a comparison signal COMP in accordance with a result of comparison between the signal VOUT and the reference signal VRAMP. The comparison signal COMP is a binary digital signal of a high level or a low level. For example, the comparison signal COMP is at the low level when the voltage of the reference signal VRAMP is lower than the voltage of the signal VOUT, and the comparison signal COMP is at the high level when the voltage of the reference signal VRAMP is higher than the voltage of the signal VOUT. Further, a control signal used for reset may be input from the timing generation unit 9 to the comparator 36.

Each of the memories 371 and 372 is a digital memory that can hold a digital signal of multiple bits. Each of the memories 371 and 372 holds the count signal CNT at a timing when the comparison signal COMP transitions from a high level to a low level. The count signal CNT held in the memories 371 and 372 represents a digital signal obtained by digitally converting the signal VOUT.

The memory 371 holds a digital signal obtained by digitally converting a signal of a reset level of the floating diffusion region FD (hereafter, referred to as "N-signal"). The memory 372 holds a digital signal obtained by digitally converting a signal in which an N-signal is superimposed on a signal of the photoelectric conversion unit PD (hereafter, referred to as "S-signal").

The memory 373 is used for holding a determination signal J in AD conversion. The determination signal J is a signal in accordance with a comparison result of the comparator 36, that is, the comparison signal COMP. Furthermore, the memory 373 may hold a signal indicating whether the reference signal VRAMP_H or VRAMP_L is used for AD conversion. The determination signal J is also input to the reference signal select unit 35, and the reference signal select unit 35 can select either the reference signal VRAMP_H or VRAMP_L based on the determination signal J.

The N-signal held in the memory 371, the S-signal held in the memory 372, and the determination signal J held in the memory 373 are read out by a control signal from the horizontal scanning circuit 6 and output to the signal processing circuit 7 via a signal line 105. The signal processing circuit 7 performs a correlated double sampling process to subtract the N-signal from the S-signal and outputs a digital signal from which a noise component has been removed.

Figure 4:
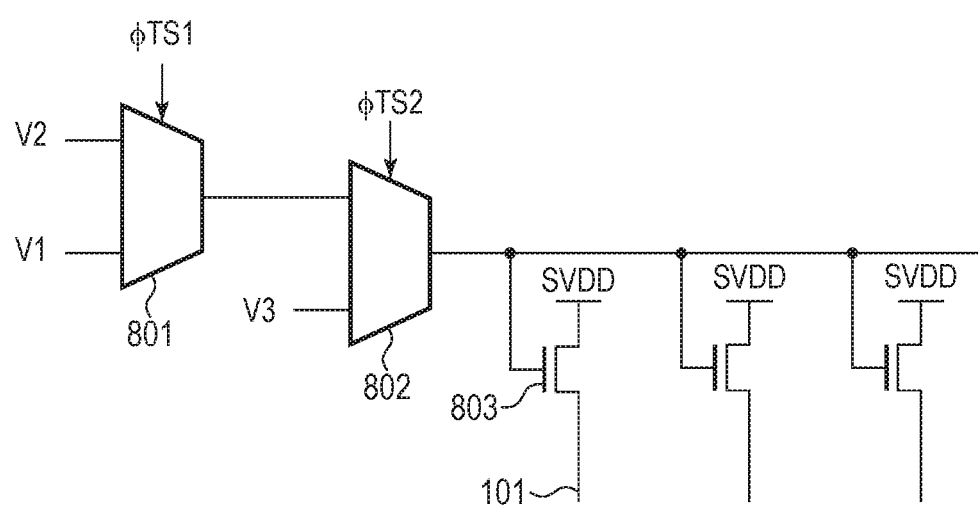
FIG. 4 is an equivalent circuit diagram of a test signal generation circuit of the first embodiment.

FIG. 4 is an equivalent circuit diagram of the test signal generation circuit 8. The test signal generation circuit 8 includes multiplexers 801 and 802 and a plurality of transistors 803. Each of the multiplexers 801 and 802 has a first input node, a second input node, a control node, and an output node. A voltage V1 is input to the first input node of the multiplexer 801, and a voltage V2 is input to the second input node. A control signal φTS1 is input to a control node of the multiplexer 801. The multiplexer 801 outputs the voltage V1 when the control signal φTS1 is at the low level and outputs the voltage V2 when the control signal φTS1 is at the high level. The voltage of the output node of the multiplexer 801 is input to the first input node of the multiplexer 802, and a voltage V3 is input to the second input node. The multiplexer 802 outputs the voltage of the output node of the multiplexer 801, that is, the voltage V1 or the voltage V2 when a control signal φTS2 is at the high level. The multiplexer 802 outputs the voltage V3 when the control signal φTS2 is at the low level. That is, any one of the voltages V1, V2, and V3 is output from the output node of the multiplexer 802 in accordance with the control signals φTS1 and φTS2.

The transistor 803 is provided on each column signal line 101 and may be an NMOS transistor, for example. The source of the transistor 803 is connected to the column signal line 101, and the drain is connected to the power source SVDD. The gate of the transistor 803 is connected to the output node of the multiplexer 802. The transistor 803 controls the voltage of the column signal line 101 in accordance with any of the voltages V1, V2, and V3 supplied to the gate. When the voltage V1 is supplied to the gate of the transistor 803, a signal supplied from the test signal generation circuit 8 to the column signal line 101 is referred to as a test signal (first test signal) VS1. When the voltage V2 is supplied to the gate of the transistor 803, a signal supplied from the test signal generation circuit 8 to the column signal line 101 is referred to as a test signal (second test signal) VS2. The test signals VS1 and VS2 are constant voltages that are different from each other and used for correction of an error in AD conversion due to variation of the reference signals VRAMP_H and VRAMP_L.

When the voltage V3 is supplied to the gate of the transistor 803, the pixel signal on the column signal line 101 is clipped at a clip voltage in accordance with the voltage V3. That is, even when there is a high luminance incident light, it is possible to prevent the voltage of the column signal line 101 from decreasing and exceeding the clip voltage and suppress smear.

Figure 5:
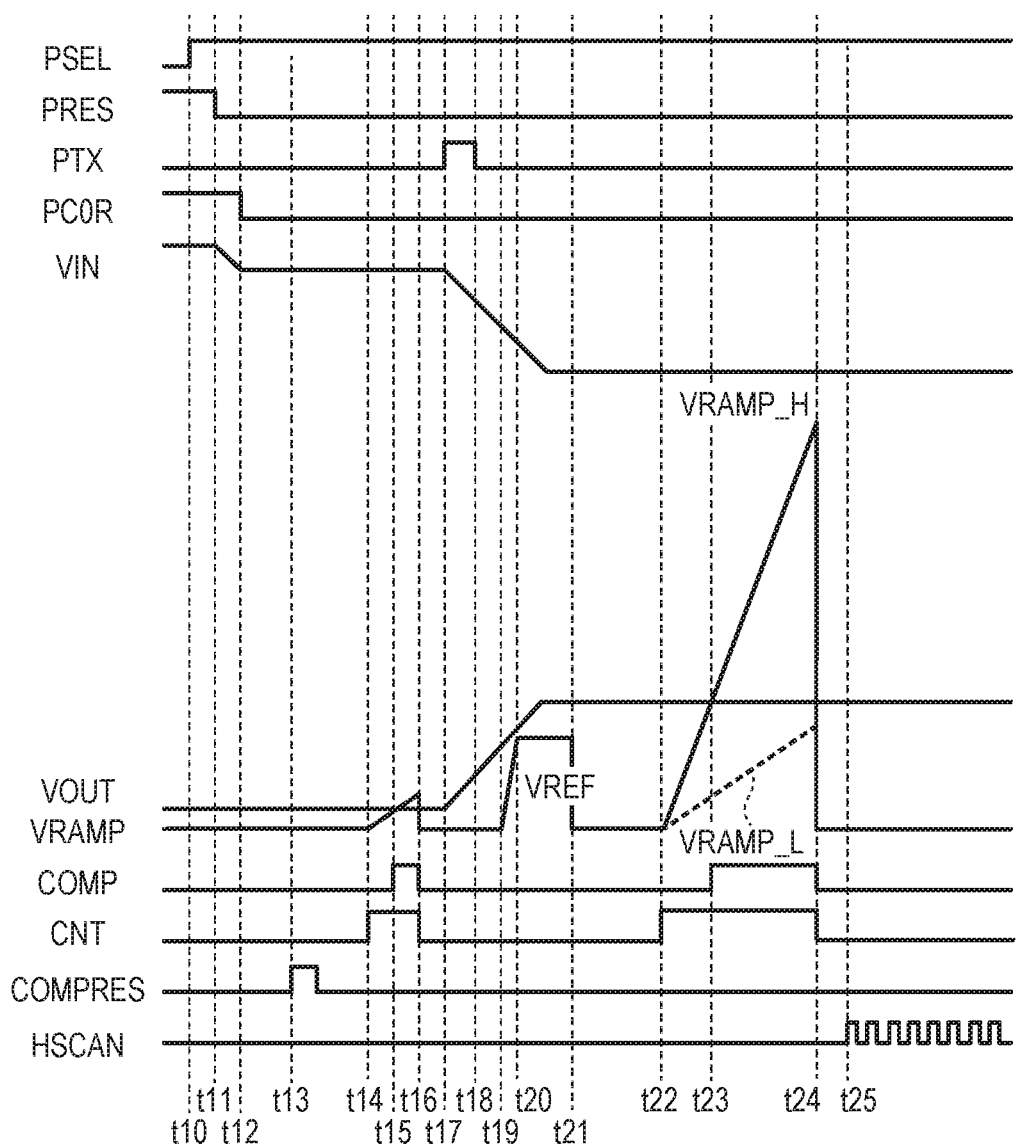
FIG. 5 is a timing chart at the time of signal readout in the imaging device of the first embodiment.

FIG. 5 is a timing chart of the time of signal readout (first drive mode) in the imaging device of the present embodiment.

At time t10, the vertical scanning circuit 2 controls the control signal PSEL on a predetermined row from a low level to a high level. The select transistor 14 of the pixel 10 is turned on, and readout of a pixel signal from the pixel 10 is ready. At this time, the control signal PRES is at the high level, the reset transistor 12 is turned on, and the potential of the floating diffusion region FD is reset to the power source voltage.

At time t11, the control signal PRES is controlled from the high level to the low level, and the reset transistor 12 is turned off from the on-state. When the control signal PRES is at the low level, the N-signal including a noise component is input from the pixel 10 to the column circuit 3 as the signal VIN.

At time t12, the control signal PC0R is controlled from the high level to the low level, and the switch S5 is turned off from the on-state. Thereby, reset of the amplifier 301 and the input capacitor C0 is released, and charges based on the voltage of the N-signal is held in the input capacitor C0. The amplifier 301 amplifies the N-signal at a gain defined by a feedback capacitor selected out of the feedback capacitors C1 to C4 by the switches S1 to S4 and outputs the signal VOUT.

At time t13, a control signal COMPRES is controlled from the low level to the high level, and the comparator 36 is reset. Furthermore, the control signal COMPRES is controlled from the high level to the low level, and the initialization of the comparator 36 is completed.

During time t14 to t16, the reference signal circuit 4 increases the voltage of the reference signal VRAMP from the initial voltage in accordance with elapsing of time. The reference signal circuit 4 can output both the reference signal VRAMP_L and the reference signal VRAMP_H at the same time to the column circuit 3. The reference signal select unit 35 turns off the switch S6H and turns on the switch S6L, and the reference signal VRAMP_L of the smaller slope is input from the source follower circuit 31L to the comparator 36. The voltage change per unit time of the reference signal VRAMP_L is smaller than the voltage change per unit time of the reference signal VRAMP_H. Thus, AD conversion with high resolution can be performed.

At time t14, in response to start of a change of the voltage of the reference signal VRAMP_L, the counter circuit 5 starts counting of a clock pulse signal and supplies the count signal CNT to the memory 371 on each column.

At time t15, when the voltage of the reference signal VRAMP_L becomes higher than the voltage of the signal VOUT, the comparison signal COMP output from the comparator 36 transitions from the low level to the high level. The count signal CNT at this time is held in the memory 371. The value of the count signal CNT held by the memory 371 represents a digital signal obtained by digitally converting the N-signal.

At time t16, the reference signal circuit 4 resets the reference signal VRAMP_L to the initial voltage. The counter circuit 5 stops counting of the clock pulse signal and resets the count signal CNT to the initial value.

During time t17 to t18, the vertical scanning circuit 2 controls the control signal PTX to the high level, and the transfer transistor 11 is turned on. Thereby, signal charges accumulated in the photoelectric conversion unit PD are transferred to the floating diffusion region FD, and the potential of the floating diffusion region FD decreases in accordance with the signal charges. The amplifier transistor 13 outputs a voltage based on the potential of the floating diffusion region FD. At this time, the signal VIN output from the amplifier transistor 13 corresponds to the S-signal. The S-signal is output to the column signal line 101 via the select transistor 14. The amplifier circuit 30 of the column circuit 3 inverts and amplifies the potential of the difference between the N-signal and the S-signal at the input capacitor C0 and outputs the signal VOUT. The signal VOUT is input to the input node of the comparator 36.

During time t19 to t20, the reference signal circuit 4 increases the voltage of the reference signal VRAMP_L from the initial voltage to the reference voltage VREF.

During time t20 to t21, the reference signal circuit 4 maintains the voltage of the reference signal VRAMP_L at the reference voltage VREF. The comparator 36 compares the reference voltage VREF with the signal VOUT. When the signal VOUT is lower than the reference voltage VREF, the comparison signal COMP output from the comparator 36 is at the high level. The comparison signal COMP is also input to the reference signal select unit 35, the reference signal select unit 35 turns off the switch S6H and turns on the switch S6L, and the reference signal VRAMP_L of the smaller slope is output from the source follower circuit 31L to the comparator 36. On the other hand, when the signal VOUT is higher than the reference voltage VREF, the comparison signal COMP is at the low level. The reference signal select unit 35 turns on the switch S6H and turns off the switch S6L, and the reference signal VRAMP_H of the larger slope is output from the source follower circuit 31H to the comparator 36.

During time t20 to t21, the comparison signal COMP is input to the reference signal select unit 35 as the determination signal J and held by the memory 373. At time t21, the determination period ends, and the reference signal circuit 4 resets the reference voltage VREF to the initial voltage in the reference signal VRAMP.

During time t22 to t24, the reference signal circuit 4 increases the voltage of the reference signals VRAMP_L and VRAMP_H from the initial voltage in accordance with elapsing of time. The reference signal select unit 35 selects either the reference signal VRAMP_L or VRAMP_H based on the comparison signal COMP obtained in the determination period (time t20 to t21). In FIG. 5, since the voltage of the signal VOUT during the determination period is higher than the reference voltage VREF, the reference signal select unit 35 selects the reference signal VRAMP_H of the larger slope. On the other hand, in the determination period, when the voltage of the signal VOUT is lower than the reference voltage VREF, the reference signal select unit 35 selects the reference signal VRAMP_L of the smaller slope.

At time t22, in response to start of a change of the voltage of the reference signal VRAMP_H or the reference signal VRAMP_L, the counter circuit 5 starts counting of the clock pulse signal and supplies the count signal CNT to the memory 372 on each column.

At time t23, when the voltage of the reference signal VRAMP_H or the reference signal VRAMP_L becomes higher than the voltage of the signal VOUT, the signal value of the comparison signal COMP output from the comparator 36 is inverted. The count signal CNT at this time is held in the memory 372. The value of the count signal CNT held by the memory 372 indicates a digital signal obtained by digitally converting the S-signal.

At time t24, the reference signal circuit 4 resets the reference signals VRAMP_L and VRAMP_H to the initial voltage. The counter circuit 5 stops counting of the clock pulse signal and resets the count signal CNT to the initial value.

From time t25, the horizontal scanning circuit 6 transfers signals held in the memories 371, 372, and 373 to the signal processing circuit 7 via the signal line 105 while sequentially scanning the column circuits 3 (HSCAN). The signal processing circuit 7 performs a correlated double sampling process of subtracting the N-signal from the S-signal and outputs a signal from which a noise component has been removed. Note that, before the correlated double sampling process, the signal processing circuit 7 performs a gain process of a digital signal of the S-signal digitally converted by using the reference signal VRAMP_H.

The gain process of a digital signal will now be described. For example, it is assumed that the slope of the reference signal VRAMP_H is four times the slope of the reference signal VRAMP_L. In such a case, the signal amplitude corresponding to one count of the count signal CNT of the reference signal VRAMP_H is four times the signal amplitude of the reference signal VRAMP_L. The signal processing circuit 7 quadruplicates the count signal CNT that has been digitally converted by using the reference signal VRAMP_H by a digital gain process. Thereby, the levels of the two digital signals, which have been digitally converted by using the different reference signals VRAMP_H and VRAMP_L for a pixel signal with the same incident light amount, can be matched.

The signal processing circuit 7 can determine whether or not a correction process is necessary for the S-signal by referencing the determination signal J. When the determination signal J=0, the signal processing circuit 7 determines that the S-signal has been digitally converted by using the reference signal VRAMP_H and performs a digital gain process to quadruplicate the S-signal. When the determination signal J=1, since the S-signal has been digitally converted by using the reference signal VRAMP_L, the signal processing circuit 7 does not perform the digital gain process.

Note that any level of the reference voltage VREF to calculate the determination signal J may be set. However, when the slope of the reference signal VRAMP_H is four times the slope of the reference signal VRAMP_L, the reference voltage VREF is preferably set to one-fourth the signal amplitude of the signal VOUT. For example, when the amplitude of the signal VOUT is 1 [V], it is preferable that the reference voltage VREF be set to a value corresponding to the amplitude of 0.25 [V]. For example, when the counter of AD conversion is capable of counting values up to 12 bits (0 to 4095 counts in decimal), it is desirable that the amplitude corresponding to 4095 counts be 0.25 [V] in the reference signal VRAMP_L. Further, it is desirable that the amplitude corresponding to 4095 counts be 1 [V] in the reference signal VRAMP_H. In such a case, in a digital signal after a digital gain process, a signal of a small amplitude that is less than or equal to 0.25 [V], that is, a signal of low luminance is converted into a digital signal corresponding to one-count step from 0 to 4095. Further, a signal of a large amplitude that is greater than 0.25 [V] and less than or equal to 1 [V], that is, a signal of high luminance is converted into a digital signal corresponding to four-count step from 4096 to 16380. In such a way, while the resolution of the high luminance signal is coarser than the resolution of the low luminance signal, fast AD conversion corresponding to 14 bits can be performed.

Herein, when the slope of the reference signal VRAMP_H is four times the slope of the reference signal VRAMP_L, the gain process described above is sufficient. However, the ratio between the slope of the reference signal VRAMP_H and the slope of the reference signal VRAMP_L may be shifted from four times due to variation in manufacturing or the like. Thus, the imaging device of the present embodiment performs a correction process on a digital signal and corrects an error of the ratio of slopes. The correction process will be described below in detail.

Figure 6:
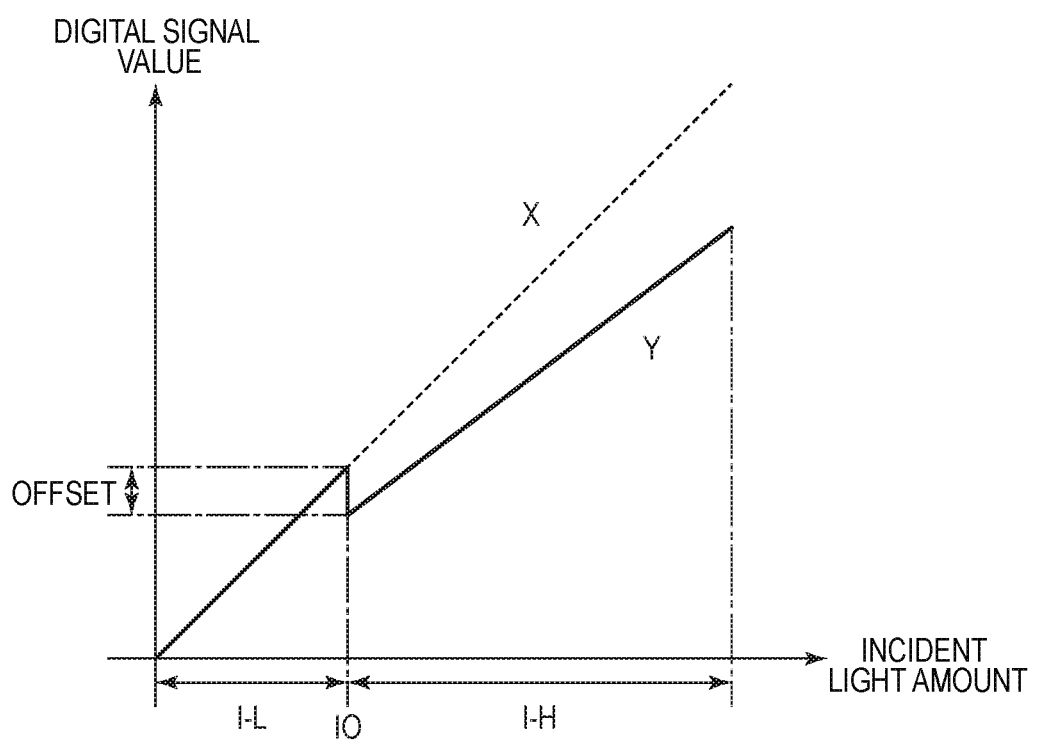
FIG. 6 is a diagram illustrating a correction process in the imaging device of the first embodiment.

FIG. 6 is a diagram illustrating a correction process in the imaging device of the present embodiment. In FIG. 6, the horizontal axis represents the incident light amount to the photoelectric conversion unit PD of the pixel 10, and the vertical axis represents the signal value of a digital signal output from the signal processing circuit 7. The graph X illustrated by a dashed line represents a characteristic of AD conversion using the reference signal VRAMP_L, and the graph Y illustrated by a solid line represents a characteristic of AD conversion using the reference signal VRAMP_H. The region I-L represents a region in the signal VOUT to be compared with the reference signal VRAMP_L, and the region I-H represents a region in the signal VOUT to be compared with the reference signal VRAMP_H. The boundary IO is a boundary between the region I-L and the region I-H. In the graph Y, AD conversion is performed by using the reference signal VRAMP_L in the region I-L, and AD conversion is performed by using the reference signal VRAMP_H in the region I-H. In the region I-H of the graph X, AD conversion is performed by using the reference signal VRAMP_L. When the ratio of voltage change per unit time of the reference signal VRAMP_H to that of the reference signal VRAMP_L is less than four times due to an error, an offset may occur in the incident light amount at the boundary IO between the region I-L and the region I-H. The correction process in the present embodiment reduces the difference (offset) of digital signals occurring between the graph X and the graph Y at the same incident light amount.

FIG. 7 is a timing chart of the time of correction value calculation (second drive mode) in the imaging device of the present embodiment. At time t200, the timing generation unit 9 controls the control signals φTS1 and φTS2 to the low level, and the test signal generation circuit 8 outputs the test signal VS1 to the column signal line 101 on each column. The amplifier circuit 30 amplifies the test signal VS1 of the column signal line 101 at a predetermined gain and outputs the signal VOUT. When the gain of the amplifier circuit 30 is one, the voltage of the signal VOUT is the same as the voltage of the test signal VS1. The timing generation unit 9 controls the control signal φSEL to the low level, and the reference signal select unit 35 selects the reference signal VRAMP_L.

At time t201, the reference signal circuit 4 increases the voltage of the reference signal VRAMP_L from the initial voltage in accordance with elapsing of time. In response to start of a change of the voltage of the reference signal VRAMP_L, the counter circuit 5 starts counting of a clock pulse signal and supplies the count signal CNT to the memory 372 on each column.

At time t202, when the level relationship between the test signal VS1 and the reference signal VRAMP_L is inverted, the signal value of the comparison signal COMP of the comparator 36 is inverted. The count signal CNT at this time is held in the memory 372. The value of the count signal CNT held in the memory 372 is denoted as a first digital signal DN1.

At time t203, the reference signal circuit 4 resets the reference signal VRAMP_L to the initial voltage. The counter circuit 5 stops counting of the clock pulse signal and resets the count signal CNT to the initial value.

During time t203 to t204, the horizontal scanning circuit 6 transfers the first digital signal DN1 held in the memory 372 to the signal processing circuit 7 via the signal line 105.

At time t204, the timing generation unit 9 controls the control signal φSEL from the low level to the high level, and the reference signal select unit 35 selects the reference signal VRAMP_H.

At time t205, the reference signal circuit 4 increases the voltage of the reference signal VRAMP_H from the initial voltage in accordance with elapsing of time. In response to start of a change of the voltage of the reference signal VRAMP_H, the counter circuit 5 starts counting of the clock pulse signal and supplies the count signal CNT to the memory 372 on each column.

At time t206, when the level relationship between the test signal VS1 and the reference signal VRAMP_H is inverted, the signal value of the comparison signal COMP output from the comparator 36 is inverted. The count signal CNT at this time is held in the memory 372. The value of the count signal CNT held in the memory 372 is denoted as a second digital signal DN2.

At time t207, the reference signal circuit 4 resets the reference signal VRAMP_H to the initial voltage. The counter circuit 5 stops counting of the clock pulse signal and resets the count signal CNT to the initial value.

During time t207 to t208, the horizontal scanning circuit 6 transfers the second digital signal DN2 held in the memory 372 to the signal processing circuit 7 via the signal line 105.

At time t208, the timing generation unit 9 controls the control signal φTS1 from the low level to the high level. The test signal generation circuit 8 outputs the test signal VS2 to each column signal line 101. When the gain of the amplifier circuit 30 is one, the voltage of the signal VOUT is the same as the voltage of the test signal VS2. The timing generation unit 9 controls the control signal φSEL from the high level to the low level, and the reference signal select unit 35 selects the reference signal VRAMP_L.

At time t209, the reference signal circuit 4 increases the voltage of the reference signal VRAMP_L from the initial voltage in accordance with elapsing of time. In response to start of a change of the voltage of the reference signal VRAMP_L, the counter circuit 5 starts counting of the clock pulse signal and supplies the count signal CNT to the memory 372 on each column.

At time t210, when the level relationship between the test signal VS2 and the reference signal VRAMP_L is inverted, the signal value of the comparison signal COMP output from the comparator 36 is inverted. The count signal CNT at this time is held in the memory 372. The value of the count signal CNT held in the memory 372 is denoted as a third digital signal DS1.

At time t211, the reference signal circuit 4 resets the reference signal VRAMP_L to the initial voltage. The counter circuit 5 stops counting of the clock pulse signal and resets the count signal CNT to the initial value.

During time t211 to t212, the horizontal scanning circuit 6 transfers the third digital signal DS1 held in the memory 372 to the signal processing circuit 7 via the signal line 105.

At time t212, the timing generation unit 9 controls the control signal φSEL from the low level to the high level, and the reference signal select unit 35 selects the reference signal VRAMP_H.

At time t213, the reference signal circuit 4 increases the voltage of the reference signal VRAMP_H from the initial voltage in accordance with elapsing of time. In response to start of a change of the voltage of the reference signal VRAMP_H, the counter circuit 5 starts counting of the clock pulse signal and supplies the count signal CNT to the memory 372 on each column.

At time t214, when the level relationship between the test signal VS2 and the reference signal VRAMP_H is inverted, the signal value of the comparison signal COMP output from the comparator 36 is inverted. The count signal CNT at this time is held in the memory 372. The count signal CNT held in the memory 372 is denoted as a fourth digital signal DS2.

At time t215, the reference signal circuit 4 resets the reference signal VRAMP_H to the initial voltage. The counter circuit 5 stops counting of the clock pulse signal and resets the count signal CNT to the initial value.

From time t215, the horizontal scanning circuit 6 transfers the fourth digital signal DS2 held in the memory 372 to the signal processing circuit 7 via the signal line 105.

As described above, the first digital signal DN1, the second digital signal DN2, the third digital signal DS1, and the fourth digital signal DS2 are sequentially transferred to the signal processing circuit 7. The signal processing circuit 7 acquires a correction value β by the following Equation (1).

$$\beta = (DS1-DN1)/(G \times (DS2-DN2)) \quad (1)$$

Here, the ratio G denotes a ratio between a voltage change per unit time of the first reference signal VRAMP_L and a voltage change per unit time of the second reference signal VRAMP_H, and the ratio G=4 in the example of FIG. 6. The value β denotes an error of the ratio between the slopes of the reference signal VRAMP_H and the reference signal VRAMP_L and corresponds to an error rate for a gain of four-fold in the example of FIG. 6. The signal processing circuit 7 performs a digital gain process of 4×β-fold on a count value digitally converted by using the reference signal VRAMP_H (fifth digital signal). When the determination signal J=0, since the count value has been digitally converted by using the reference signal VRAMP_H, the signal processing circuit 7 performs a process of multiplying the count value by 4×β. When the determination signal J=1, since the count value has been digitally converted by using the reference signal VRAMP_L, the signal processing circuit 7 does not perform the digital gain process of multiplying the count value by 4×β.

The signal processing circuit 7 can reduce an error of a digital signal due to variation of the ratio of the voltage changes per unit time of the plurality of reference signals VRAMP_H and VRAMP_L by performing the correction described above.

Note that the correction value β may be calculated from respective average values of the digital signals DN1, DN2, DS1, and DS2 of the column circuits 3 on the plurality of columns. Furthermore, the correction value β may be calculated from respective average values of the digital signals DN1, DN2, DS1, and DS2 of a plurality of frames. By averaging a plurality of correction values β, random noise contained in the correction value β is reduced, and the signal processing circuit 7 can generate a digital signal with reduced influence of random noise.

Furthermore, the imaging device of the present embodiment can perform a drive mode in which the column circuit 3 in an operating state (hereafter, referred to as "operating column") and the column circuit 3 in a state where current consumption is reduced compared to the column circuit 3 in the operating state (hereafter, referred to as "power-off column") are mixed. For example, when performing capturing by using only the center portion of the pixel unit 1 in a crop readout mode of a moving image, the imaging device can operate only the column circuit 3 which performs readout and cut or reduce the drive current of the column circuit 3 which does not perform readout. Thereby, the power consumption of the imaging device can be reduced. In response to receiving a power-off signal from the timing generation unit 9, the operating column cuts or reduces the drive current to the current sources 311H and 311L and the comparator 36 and transitions to a power-off column. Further, in response to receiving a power-on signal from the timing generation unit 9, the power-off column supplies the drive current to the current sources 311H and 311L and the comparator 36 and transitions to an operating column. Herein, when a power-off column and an operating column are mixed, a slope correction error of the reference signal VRAMP may occur. The reason why a slope correction error occurs will be described below with reference to FIG. 8A and FIG. 8B.

FIG. 8A and FIG. 8B are diagrams of a comparative example illustrating a slope correction error of a reference signal. An operating column (first column circuit) 3A and a power-off column (second column circuit) 3B illustrated in FIG. 8A and FIG. 8B represent the source follower circuits 31H and 31L, the reference signal select units 35, and the comparators 36 extracted from the column circuits 3, respectively.

FIG. 8A illustrates the operating column 3A and the power-off column 3B at the time of correction value calculation using the reference signal VRAMP_H (FIG. 7, t205 to t207, t213 to t215). The wiring of the reference signal VRAMP_L (first reference signal wiring) is connected commonly to the gates of the source follower circuits 31L on the operating column 3A and the power-off column 3B. The wiring of the reference signal VRAMP_H (second reference signal wiring) is connected commonly to the gates of the source follower circuits 31H on the operating column 3A and the power-off column 3B. On the power-off column 3B, the current source 311H of the source follower circuit 31H, the current source 311L of the source follower circuit 31L, and the comparator 36 are in the off-state. On the operating column 3A, the current source 311H of the source follower circuit 31H, the current source 311L of the source follower circuit 31L, and the comparator 36 are in the on-state. Herein, the on-state is a state where a drive current is supplied to a circuit, and the off-state is a state where a drive current of a circuit is cut or limited. Since the reference signal VRAMP_H is selected at the time of correction value calculation, the switches S6H on the operating column 3A and the power-off column 3B are in the on-state.

FIG. 8B illustrates the operating column 3A and the power-off column 3B at the time of high luminance pixel signal readout. On the operating column 3A, the switch S6H on the source follower circuit 31H side is turned on to read out a high luminance pixel signal, and the reference signal VRAMP_H is input to the comparator 36. On the power-off column 3B, since the comparator 36 is in the off-state, the reference signal selection operation is not performed. Thus, the switch S6L on the source follower circuit 31L side is maintained at the on-state.

The switch S6H on the source follower circuit 31H side on the power-off column 3B differs in the state of on or off between the time of slope correction value calculation using the reference signal VRAMP_H (FIG. 8A) and the time of high luminance pixel signal readout (FIG. 8B). In FIG. 8A, the switch S6H on the source follower circuit 31H side is turned on at the time of correction value calculation using the reference signal VRAMP_H. On the power-off column 3B, since the current source 311H is in the off-state, the drive current of the transistor 312H is cut. The transistor 312H is turned off, and the impedance of the source increases. Further, the source voltage of the transistor 312H is around 0 V and thus is not changed by the gate voltage. Thus, the capacitance from the gate to the source of the transistor 312H increases. Here, since the switch S6H is in the on-state, the source of the transistor 312H is electrically connected to a wiring W1 from the source to the switch S6H and a wiring W2 from the switch S6H to the input node of the comparator 36 and the switch S6L. The gate of the transistor 312H on the power-off column 3B is affected by the parasitic capacitance of the wiring W1 and the parasitic capacitance of the wiring W2 via the source, and the apparent parasitic capacitance of the gate of the transistor 312H increases. The load capacitance of the wiring of the reference signal VRAMP_H connected to the power-off column 3B increases, and the amplitude (slope) of the reference signal VRAMP_H decreases. Since the wiring of the reference signal VRAMP_H is connected commonly to the operating column 3A and the power-off column 3B, the reference signal VRAMP_H having a slope error affects AD conversion on the operating column 3A. The gain of a digital signal digitally converted by using the reference signal VRAMP_H having a small slope is larger than the gain of a digital signal digitally converted by using the reference signal VRAMP_H having no slope error.

On the other hand, at the time of high luminance pixel signal readout (FIG. 8B), the switch S6H on the source follower circuit 31H side on the power-off column 3B is in the off-state, and the wiring W2 is electrically isolated from the wiring W1. Thus, the gate of the transistor 312H is no longer affected by the parasitic capacitance of the wiring W2, and the load capacitance of the wiring of the reference signal VRAMP_H also decreases. The slope error of the reference signal VRAMP_H decreases, and the slope of the reference signal VRAMP_H in FIG. 8B becomes larger than the slope of the reference signal VRAMP_H in FIG. 8A. As a result, the gain of a digital signal at the time of high luminance pixel signal readout becomes smaller than the gain of a digital signal at the time of slope correction value calculation.

Note that, on the operating column 3A, since the current sources 311H and the transistor 312H of the source follower circuit 31H are in the on-state, the source voltage of the transistor 312H is substantially the same as the gate voltage. Thus, the gate of the transistor 312H is not affected by the parasitic capacitance of the wirings W1 and W2 on the source side. That is, on the operating column 3A, variation of the reference signal VRAMP_H is small at the time of slope correction value calculation (FIG. 8A) and at the time of high luminance pixel signal readout (FIG. 8B).

As described above, since the wiring of the reference signal VRAMP_H is connected commonly to the operating column 3A and the power-off column 3B, variation of the parasitic capacitance on the wiring of the reference signal VRAMP_H affects an AD conversion result on the operating column 3A. That is, a difference occurs in the gain of the reference signal VRAMP_H between the time of correction value calculation and the time of pixel signal readout. Slope correction of a reference signal is performed assuming that the slopes of the reference signal VRAMP_H are the same at the time of correction value calculation and at the time of pixel signal readout, and a correction error may occur if both the slopes differ from each other. According to the present embodiment, as described in detail below, at the time of pixel signal readout and at the time of correction value calculation, since the power-off column 3B selects the same reference signal out of the same reference signals VRAMP_H and VRAMP_L, it is possible to suppress variation of the parasitic capacitance due to a change of a connection state of reference signal wirings. As a result, a correction error due to variation of the gain of the reference signals VRAMP_H and VRAMP_L can be reduced, and accurate correction can be performed.

FIG. 9A and FIG. 9B are diagrams illustrating an operating column and a power-off column of the imaging device of the present embodiment. FIG. 9A illustrates the operating column 3A and the power-off column 3B at the time of correction value calculation using the reference signal VRAMP_H. Further, FIG. 9B illustrates the operating column 3A and the power-off column 3B at the time of high luminance pixel signal readout.

In the present embodiment, the switch S6H on the source follower circuit 31H side of the power-off column 3B is controlled to the on-state both at the time of correction value calculation (FIG. 9A) and at the time of pixel signal readout (FIG. 9B). Specifically, the timing generation unit 9 controls the control signal φSEL to the reference signal select unit 35 to turn on the switch S6H in synchronization with a control signal that powers off the column circuit 3. Further, the reference signal select unit 35 may turn on the switch S6H in synchronization with a power-off signal. That is, when the operating column 3A transitions to the power-off column 3B, the switches S6H and S6L may be switched in synchronization with a control signal of powering off. The switch S6H is in the on-state at the time of correction value calculation and at the time of pixel signal readout, and the wirings W1 and W2 remain to be conducted. The parasitic capacitance from the gate to the source of the transistor 312H is constant at the time of correction value calculation and at the time of pixel signal readout. Therefore, since the load capacitance of the wiring of the reference signal VRAMP_H does not change between the time of correction value calculation and the time of pixel signal readout, the difference in the gain of the reference signal VRAMP_H can be reduced, and slope correction can be performed at high accuracy.

FIG. 10 illustrates selection states of the reference signals VRAMP_H and VRAMP_L on an operating column and a power-off column at each of the time of correction value calculation and the time of pixel signal readout in the imaging device of the present embodiment. In FIG. 10, the horizontal field represents (1) a case of using the reference signal VRAMP_L at the time of correction value calculation, (2) a case of using the reference signal VRAMP_H at the time of correction value calculation, (3) a case of performing low luminance pixel signal readout, and (4) a case of performing high luminance pixel signal readout. The vertical field represents whether the reference signal VRAMP_H or VRAMP_L is selected on the operating column 3A and the power-off column 3B in respective cases of (1) to (4). When the reference signal VRAMP_H is selected for the power-off column 3B in (1) to (4), the switch S6H is controlled to the on-state, and the switch S6L is controlled to the off-state. In the present embodiment, the power-off column 3B selects the reference signal VRAMP_H (2) at the time of correction value calculation using the reference signal VRAMP_H and (4) at the time of pixel signal readout. Therefore, variation of the parasitic capacitance caused by a change of the wiring connection state of the reference signal VRAMP_H can be suppressed, a correction error of the reference signal due to variation of the gain of the reference signal can be reduced, and accurate correction can be performed. Note that the switch S6H on the power-off column may be controlled to the on-state also (1) at the time of correction value calculation using the reference signal VRAMP_L and (3) at the time of low luminance pixel signal readout.

As described above, according to the present embodiment, since the power-off column selects the same reference signal at the time of pixel signal readout and at the time of correction value calculation on the power-off column, variation of the parasitic capacitance caused by a change of the connection state of the reference signal wiring can be suppressed. As a result, a correction error due to variation of the gain of the reference signals can be reduced, and accurate correction can be performed.

Second Embodiment

Next, an imaging device of a second embodiment will be described mainly for a configuration different from the first embodiment. In the imaging device of the present embodiment, the power-off column 3B selects the reference signal VRAMP_L both at the time of correction value calculation and the time of pixel signal readout.

Figure 11A:
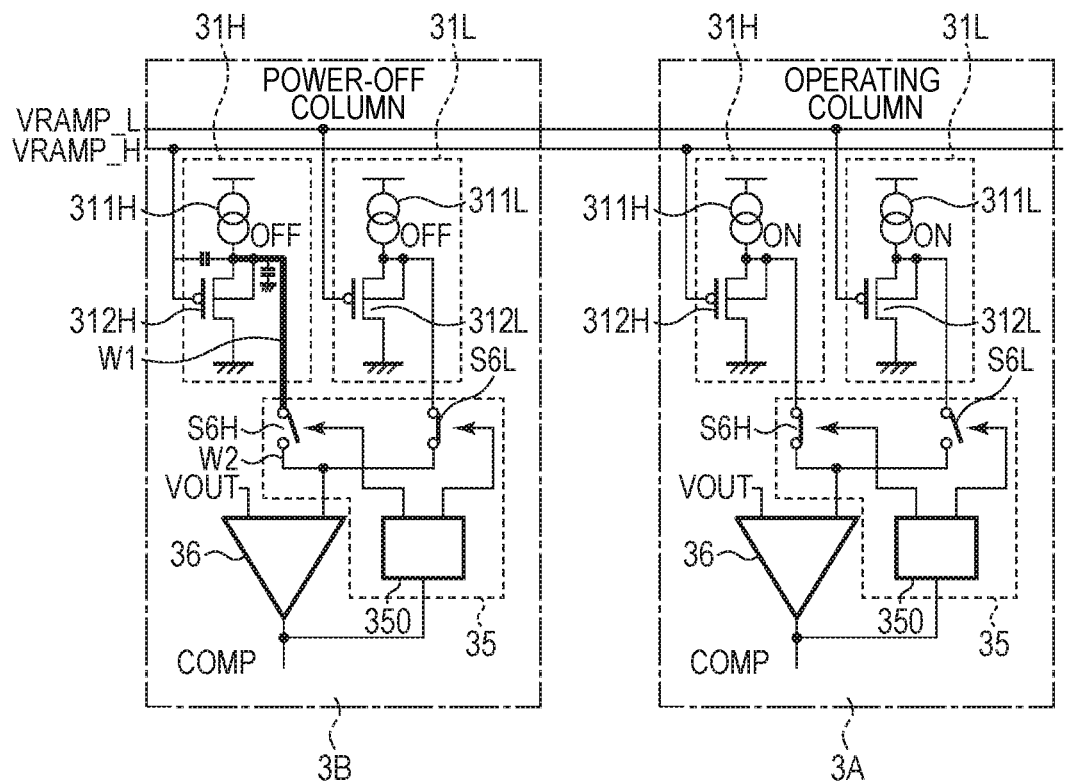
FIG. 11A is a diagram illustrating an operating column and a power-off column in an imaging device of a second embodiment.
Figure 11B:
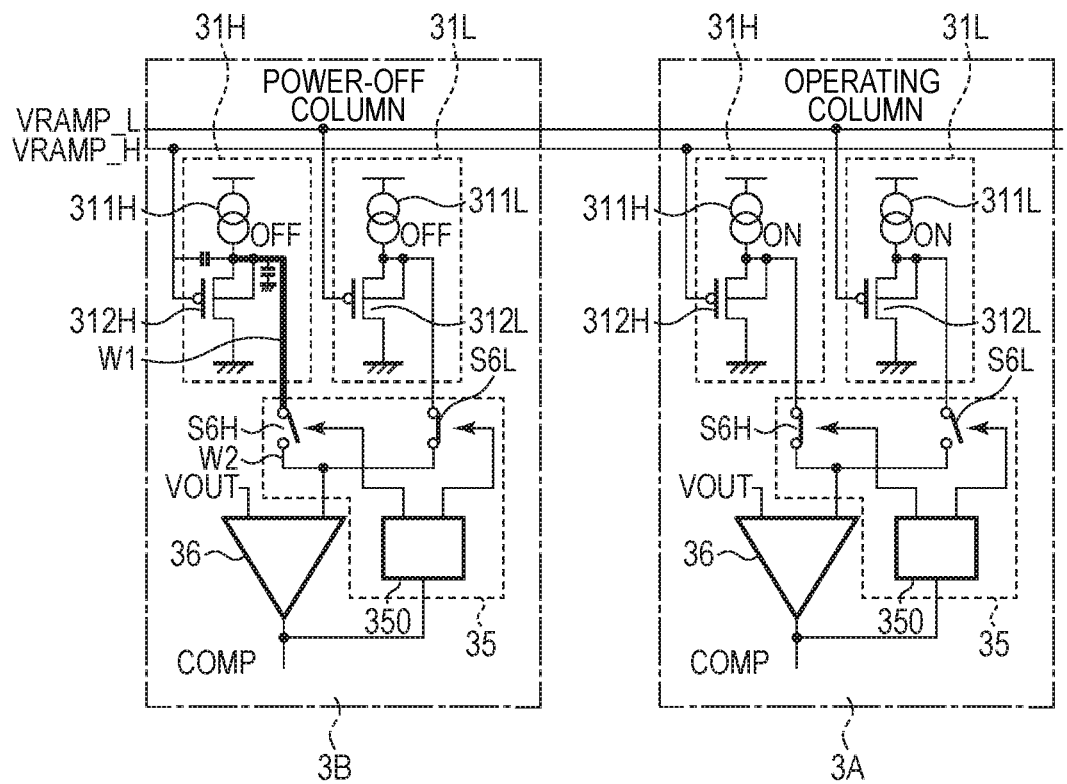
FIG. 11B is a diagram illustrating an operating column and a power-off column in the imaging device of the second embodiment.

FIG. 11A and FIG. 11B are diagrams illustrating an operating column and a power-off column of the imaging device of the present embodiment. FIG. 11A illustrates the operating column 3A and the power-off column 3B at the time of correction value calculation using the reference signal VRAMP_H. Further, FIG. 11B illustrates the operating column 3A and the power-off column 3B at the time of high luminance pixel signal readout.

In the present embodiment, the switch S6H on the source follower circuit 31H side of the power-off column 3B is controlled to the on-state both at the time of correction value calculation (FIG. 11A) and at the time of pixel signal readout (FIG. 11B), and the wiring W2 is electrically isolated from the source of the transistor 312H and the wiring W1. The gate of the transistor 312H is affected by the parasitic capacitance of the wiring W1 on the source side but no longer affected by the parasitic capacitance of the wiring W2. In the present embodiment, since the power-off column 3B selects the same reference signal VRAMP_L both at the time of correction value calculation and at the time of pixel signal readout, the connection state of the wiring of the reference signal VRAMP_H does not change. Accordingly, variation of the parasitic capacitance of the wiring of the reference signal VRAMP_H can be suppressed, the difference in the gain of the reference signal VRAMP_H can be reduced, and slope correction can be performed at high accuracy.

Note that, also when the reference signal VRAMP_L is used at the time of correction value calculation, the switch S6H of the power-off column 3B may be controlled to the off-state at both the time of correction value calculation and the time of low luminance pixel signal readout. Also in such a case, the parasitic capacitance on the wiring of the reference signal VRAMP_L is constant, and the difference in the gain of the reference signal VRAMP_L can be reduced. Accordingly, slope correction can be performed at high accuracy.

FIG. 12 illustrates selection states of the reference signals VRAMP_H and VRAMP_L on an operating column and a power-off column at each of the time of correction value calculation and the time of pixel signal readout in the imaging device of the present embodiment. In FIG. 12, the horizontal field represents (1) a case of using the reference signal VRAMP_L at the time of correction value calculation, (2) a case of using the reference signal VRAMP_H at the time of correction value calculation, (3) a case of performing low luminance pixel signal readout, and (4) a case of performing high luminance pixel signal readout. The vertical field represents whether the reference signal VRAMP_H or VRAMP_L is selected on the operating column and the power-off column in respective cases of (1) to (4). The power-off column 3B selects the reference signal VRAMP_L (2) at the time of correction value calculation using the reference signal VRAMP_H and (4) at the time of pixel signal readout. Therefore, variation of the parasitic capacitance caused by a change of the wiring connection state of the reference signal VRAMP_H can be suppressed, a correction error due to variation of the gain of the reference signal VRAMP_H can be reduced, and accurate correction can be performed. Note that the switch S6H on the power-off column may be controlled to the off-state also (1) at the time of correction value calculation using the reference signal VRAMP_L and (3) at the time of low luminance pixel signal readout. In such a case, variation of the parasitic capacitance caused by a change of the connection state of the wiring of the reference signal VRAMP_L can be suppressed, and slope correction can be performed at high accuracy.

As described above, also in the present embodiment, since the power-off column selects the same reference signal at the time of pixel signal readout and at the time of correction value calculation, variation of the parasitic capacitance caused by a change of the connection state of the reference signal wiring can be suppressed. As a result, a correction error of the reference signals due to variation of the gain of the reference signals can be reduced, and accurate correction can be performed.

Third Embodiment

Next, an imaging device of the present embodiment will be described mainly for a configuration different from the first embodiment. In the present embodiment, at the time of AD conversion using a test signal, the amplifier gain of the amplifier circuit 30 is controlled to be less than or equal to an amplifier gain at the time of pixel signal readout.

In FIG. 3, the amplifier circuit 30 of the column circuit 3 can switch the amplifier gain in accordance with a camera ISO sensitivity setting. For example, when ISO100 corresponds to an amplifier gain of one-fold of a column circuit, ISO200 corresponds to an amplifier gain of two-fold, and ISO400 corresponds to an amplifier gain of four-fold. The amplifier gain is determined by a ratio of the capacitances of the feedback capacitors C1, C2, C3, and C4 to be connected to the feedback path of the amplifier 301 and the capacitance of the input capacitor C0 in the column circuit 3. The capacitances of C1, C2, C3, and C4 of the present embodiment are ⅛-fold, ⅛-fold, ¼-fold, and ½-fold of the capacitance of the input capacitor C0, respectively. When switches S1, S2, S3, and S4 are turned on, the capacitances of the feedback capacitors C1, C2, C3, and C4 are added, and the gain of the amplifier circuit 30 will be 1/(⅛+⅛+¼+½)=1. When the switches S1 and S2 are turned on, the capacitances of the feedback capacitors C1 and C2 are added, and the gain will be 1/(⅛+⅛)=4.

Here, it is assumed that the imaging device operates at ISO 400, that is, an amplifier gain of four-fold at the time of pixel signal readout. When the imaging device operates at an amplifier gain of four-fold also at the time of correction value calculation, the test signals VS1 and VS2 will be amplified at an amplifier gain of four-fold, and no correct correction value will be calculated. Accordingly, the imaging device of the present embodiment switches the amplifier gain between the time of correction value calculation and the time of pixel signal readout. For example, the amplifier gain is set at one-fold at the time of correction value calculation, and the amplifier gain is set at four-fold at the time of pixel signal readout. In such a way, it is possible to obtain an accurate slope correction value in the same manner as in the first embodiment at the time of correction value calculation by switching the amplifier gain between the time of correction value calculation and the time of pixel signal readout. Even when the amplifier gain is switched between the time of correction value calculation and the time of pixel signal readout, the slopes and the digital gains of the reference signal VRAMP_L and the VRAMP_H are the same. Thus, slope correction of a reference signal can be performed at high accuracy by using a slope correction value obtained at an amplifier gain of one-fold.

Also in the present embodiment, the same advantageous effect as the first and second embodiments can be obtained. That is, since the power-off column selects the same reference signal at the time of pixel signal readout and at the time of correction value calculation, variation of the parasitic capacitance of wirings of the reference signals caused by a change of the connection state of the reference signal wiring can be suppressed. As a result, a correction error of the reference signals due to variation of the gain of the reference signals can be reduced.

Fourth Embodiment

Figure 13:
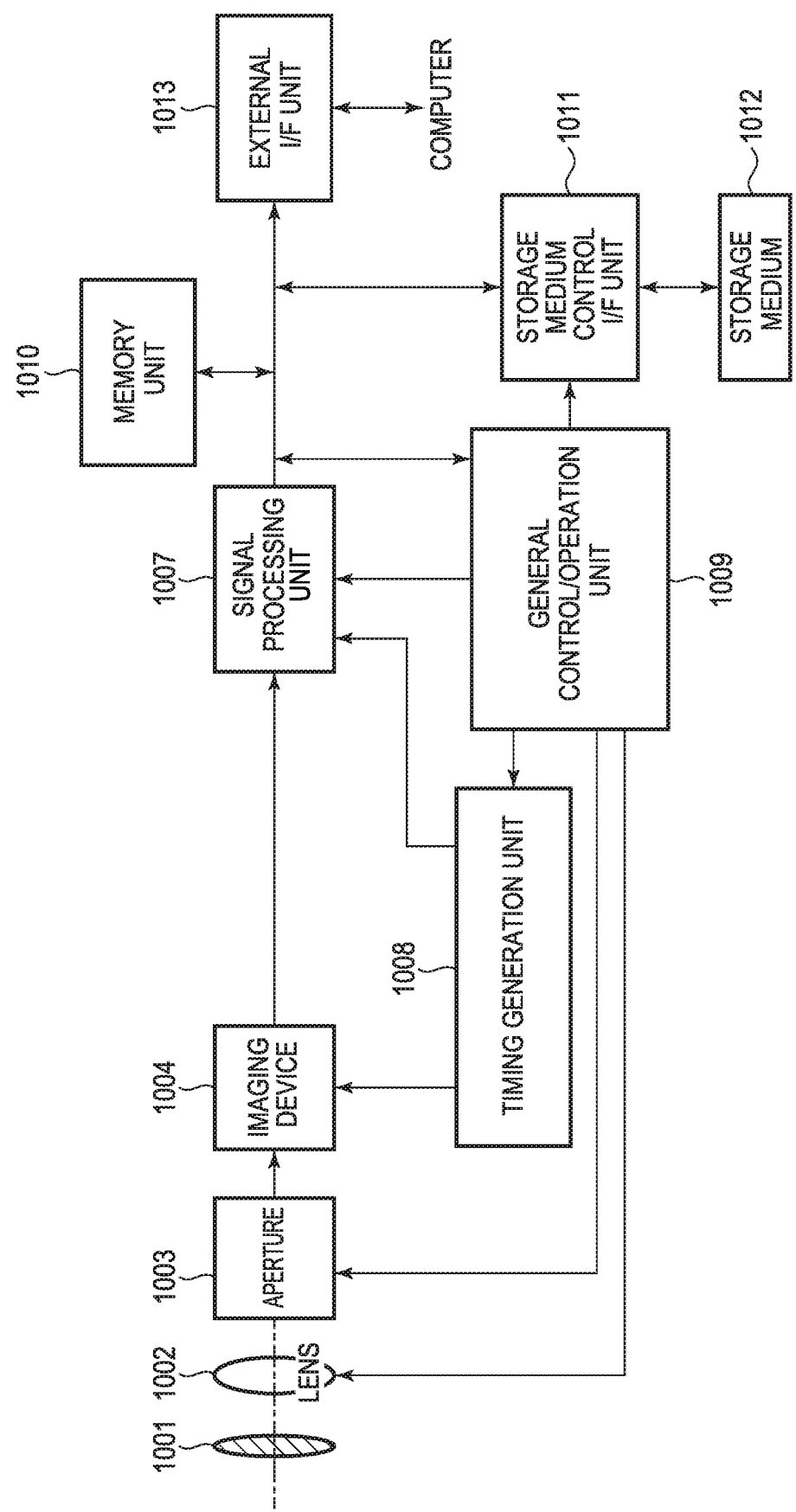
FIG. 13 is a block diagram of an imaging system of a fourth embodiment.

Each solid state imaging device in the embodiments described above is applicable to various imaging systems. The imaging system may be a digital still camera, a digital camcorder, a camera head, a copy machine, a fax machine, a mobile phone, an on-vehicle camera, an observation satellite, a surveillance camera, or the like. FIG. 13 illustrates block diagram of a digital still camera as an example of an imaging system.

An imaging system illustrated in FIG. 13 includes a barrier 1001, a lens 1002, an aperture 1003, an imaging device 1004, a signal processing unit 1007, a timing generation unit 1008, a general control/operation unit 1009, a memory unit 1010, a storage medium control I/F unit 1011, a storage medium 1012, and an external I/F unit 1013. The barrier 1001 protects the lens 1002, and the lens 1002 captures an optical image of an object onto the imaging device 1004. The aperture 1003 changes the amount of light that has passed through the lens 1002. The imaging device 1004 includes a solid state imaging device of each of the embodiments described above and converts an optical image captured by the lens 1002 into image data. The signal processing unit 1007 performs various correction or data compression on image data output from the imaging device 1004. The timing generation unit 1008 outputs various timing signals to the imaging device 1004 and the signal processing unit 1007. The general control/operation unit 1009 controls the entire digital still camera, and the memory unit 1010 temporarily stores image data. The storage medium control I/F unit 1011 is an interface used for storage or readout of image data on the storage medium 1012, and the storage medium 1012 is a removable storage medium such as a semiconductor memory used for storage or readout of imaging data. The external I/F unit 1013 is an interface used for communicating with an external computer or the like. A timing signal or the like may be input from the outside of the imaging system, and the imaging system may be any imaging system having at least the imaging device 1004 and the signal processing unit 1007 that processes an image signal output from the imaging device 1004.

In the present embodiment, the configuration in which the imaging device 1004 and the AD conversion unit are provided on the same semiconductor substrate has been described. However, the imaging device 1004 and the AD conversion unit may be formed on the separate semiconductor substrates. Further, the imaging device 1004 and the signal processing unit 1007 may be formed on the same semiconductor substrate.

Further, each pixel may include a first photoelectric conversion unit and a second photoelectric conversion unit. The signal processing unit 1007 may be configured to process a pixel signal based on charges generated by the first photoelectric conversion unit and a pixel signal based on charges generated by the second photoelectric conversion unit and acquire distance information on the distance from the imaging device 1004 to an object.

Fifth Embodiment

Figure 14A:
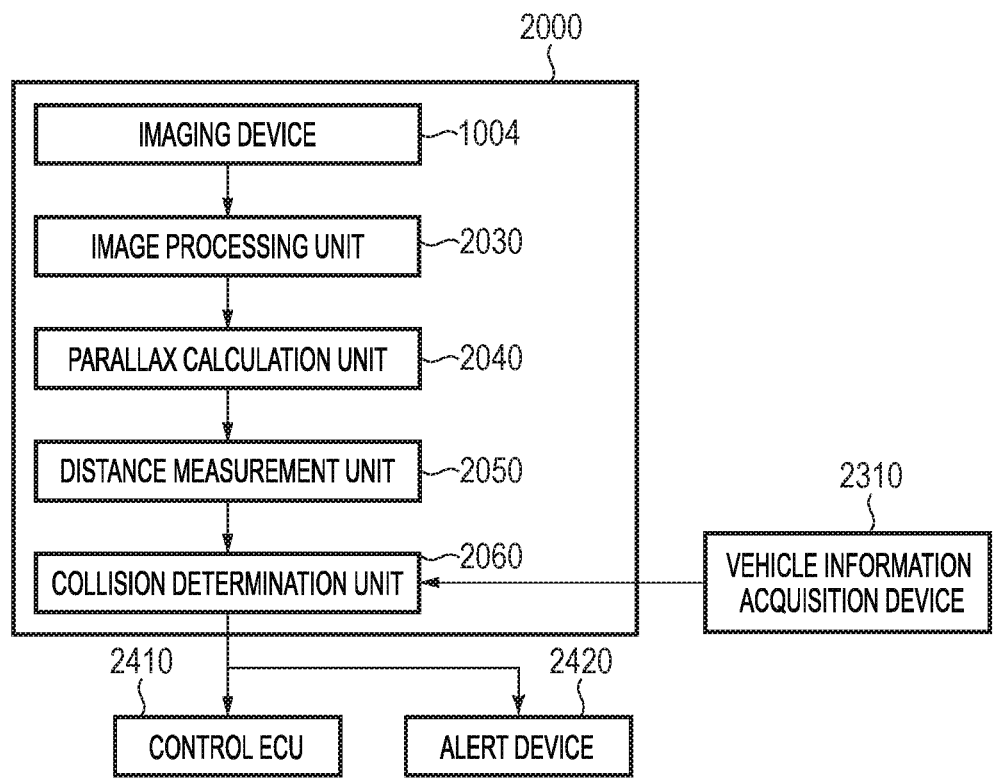
FIG. 14A is a block diagram of an imaging system of a fifth embodiment.
Figure 14B:
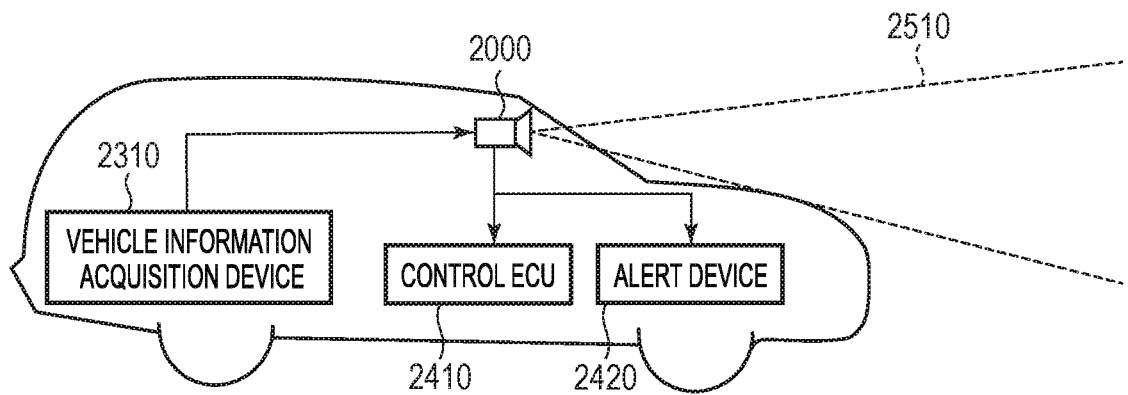
FIG. 14B is a block diagram of the imaging system of the fifth embodiment.

FIG. 14A and FIG. 14B illustrates one example of an imaging system related to an on-vehicle camera in a fifth embodiment of the present invention. An imaging system 2000 has an imaging device 1004 of any of the embodiments described above. The imaging system 2000 has an image processing unit 2030 that performs image processing on a plurality of image data acquired by the imaging device 1004 and a parallax calculation unit 2040 that calculates a parallax (a phase difference of parallax images) from the plurality of image data acquired by the imaging system 2000. Further, the imaging system 2000 has a distance measurement unit 2050 that calculates a distance to the object based on the calculated parallax and a collision determination unit 2060 that determines whether or not there is a collision possibility based on the calculated distance. Here, the parallax calculation unit 2040 and the distance measurement unit 2050 are an example of a distance information acquisition device that acquires distance information on the distance to the object. That is, the distance information is information on a parallax, a defocus amount, a distance to an object, or the like. The collision determination unit 2060 may use any of the distance information to determine the collision possibility. The distance information acquisition device may be implemented by dedicatedly designed hardware or may be implemented by a software module. Further, the distance information acquisition device may be implemented by a field programmable gate array (FPGA) or an application specific integrated circuit (ASIC) or may be implemented by a combination thereof.

The imaging system 2000 is connected to the vehicle information acquisition device 2310 and can acquire vehicle information such as a vehicle speed, a yaw rate, a steering angle, or the like. Further, the imaging system 2000 is connected to a control ECU 2410, which is a control device that outputs a control signal for causing a vehicle to generate braking force based on a determination result by the collision determination unit 2060. Further, the imaging system 2000 is also connected to an alert device 2420 that issues an alert to the driver based on a determination result by the collision determination unit 2060. For example, when the collision probability is high as the determination result of the collision determination unit 2060, the control ECU 2410 performs vehicle control to avoid a collision or reduce damage by applying a brake, pushing back an accelerator, suppressing engine power, or the like. The alert device 2420 alerts a user by sounding an alert such as a sound, displaying alert information on a display of a car navigation system or the like, providing vibration to a seat belt or a steering wheel, or the like. The imaging system 2000 functions as a control unit that controls the operation of controlling a vehicle as described above.

In the present embodiment, an area around a vehicle, for example, a front area or a rear area is captured by using the imaging system 2000. FIG. 14B illustrates the imaging system when a front area of a vehicle (a capturing area 2510) is captured. The vehicle information acquisition device 2310 as an imaging control unit instructs the imaging system 2000 or the imaging device 1004 to perform the operation described in the first to fifth embodiments. Since the operation of the imaging device 1004 is the same as that in the first to fourth embodiments, the description thereof will be omitted here. Such a configuration can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as an automobile and can be applied to a moving unit (moving apparatus) such as a ship, an airplane, or an industrial robot, for example. In addition, the imaging system can be widely applied to a device which utilizes object recognition, such as an intelligent transportation system (ITS), without being limited to moving units.

OTHER EMBODIMENTS

The present invention is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is also one of the embodiments of the present invention.

While the configuration in which a reference signal increases with time has been illustrated as an example in the embodiments described above, a configuration in which the reference signals VRAMP_H and VRAMP_L both decrease with time may be employed. Therefore, any direction of change may be employed as long as the direction of change of a reference signal is not inverted or as long as any direction of increase or decrease is maintained. Further, a change of a gain in the column circuit may be performed by using an attenuator without being limited to by changing the gain of the amplifier circuit.

Note that all of the embodiments described above are mere embodied examples in implementing the present invention, and the technical scope of the present invention should not be construed in a limiting sense by these embodiments. That is, the present invention can be implemented in various forms without departing from the technical concept or the primary feature thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-066853, filed Mar. 29, 2019, which is hereby incorporated by reference herein in its entirety.

What is claimed is:

1. An imaging device comprising:
    a pixel unit including a plurality of pixels that are arranged in a matrix and each output a pixel signal in accordance with a received light amount;
    a reference signal circuit that outputs a first reference signal and a second reference signal, wherein voltages of the first and second reference signals respectively change in dependent on time and a voltage change per unit time of the first reference signal is different from a voltage change per unit time of the second reference signal; and
    a plurality of column circuits each of which is provided on a corresponding column signal line of the pixel unit and includes a selector circuit that selects either the first reference signal or the second reference signal and a comparator that outputs a comparison signal indicating a result of comparison between the pixel signal and a reference signal selected by the selector circuit,
    wherein the column circuits operate selectively in a first drive mode to output the comparison signal or a second drive mode to acquire a correction value of a ratio between the voltage change per unit time of the first reference signal and the voltage change per unit time of the second reference signal,
    wherein the plurality of column circuits include a first column circuit that operates in the first drive mode and a second column circuit that is driven by a smaller current than a current of the first column circuit, and
    wherein the selector circuit of the second column circuit selects the same reference signal out of the first reference signal and the second reference signal in the first drive mode and the second drive mode.

2. The imaging device according to claim 1,
    wherein a voltage change per unit time of the first reference signal is smaller than a voltage change per unit time of the second reference signal, and
    wherein the selector circuit of the second column circuit selects the second reference signal in the first drive mode and the second drive mode.

3. The imaging device according to claim 1,
    wherein a voltage change per unit time of the first reference signal is smaller than a voltage change per unit time of the second reference signal, and
    wherein the selector circuit of the second column circuit selects the first reference signal in the first drive mode and the second drive mode.

4. The imaging device according to claim 1, wherein the selector circuit selects either the first reference signal or the second reference signal in accordance with an amplitude of the pixel signal.

5. The imaging device according to claim 1,
wherein each of the column circuits includes an amplifier circuit that amplifies a signal of the column signal line, and
wherein a gain of the amplifier circuit in the second drive mode is less than or equal to a gain of the amplifier circuit in the first drive mode.

6. The imaging device according to claim 1,
wherein the column circuit includes a first source follower circuit and a second source follower circuit, the first reference signal is input to a gate of the first source follower circuit, and the second reference signal is input to a gate of the second source follower circuit,
wherein the selector circuit includes a first switch provided between a source of the first source follower circuit and a first input node of the comparator and a second switch provided between a source of the second source follower circuit and the first input node of the comparator, and
wherein a signal of the column signal line is input to a second input node of the comparator.

7. The imaging device according to claim 6, wherein the gate of the first source follower circuit in the first column circuit is connected to the gate of the first source follower circuit in the second column circuit via a first reference signal wiring, and wherein the gate of the second source follower circuit in the first column circuit is connected to the gate of the second source follower circuit in the second column circuit via a second reference signal wiring.

8. The imaging device according to claim 6, wherein the selector circuit of the second column circuit turns off the first switch and turns on the second switch in the first drive mode and the second drive mode.

9. The imaging device according to claim 6, wherein the selector circuit of the second column circuit turns on the first switch and turns off the second switch in the first drive mode and the second drive mode.

10. The imaging device according to claim 6,
wherein each of the first source follower circuit and the second source follower circuit includes a current source between a source and a power source,
wherein in the first column circuit, the current source of the first source follower circuit and the current source of the second source follower circuit are in an on-state, and
wherein in the second column circuit, the current source of the first source follower circuit and the current source of the second source follower circuit are in an off-state.

11. The imaging device according to claim 10,
wherein the comparator in the first column circuit is in an on-state, and
wherein the comparator in the second column circuit is in an off-state.

12. The imaging device according to claim 6, wherein the first column circuit transitions to the second column circuit in accordance with a control signal and switches the first switch and the second switch in synchronization with the control signal.

13. The imaging device according to claim 1 further comprising a signal processing circuit that processes a digital signal from the column circuits,
wherein each of the column circuits outputs, as the digital signal, a count value of clock pulses from a time when the reference signal circuit starts changing a voltage of the first reference signal or the second reference signal to a time when the comparison signal changes to the signal processing circuit.

14. The imaging device according to claim 13 further comprising a test signal generation circuit that supplies a test signal to the column signal line in the second drive mode,
wherein the signal processing circuit acquires the correction value based on the digital signal based on a comparison result between the first reference signal and the test signal and the digital signal based on a comparison result between the second reference signal and the test signal in the second drive mode and performs correction on the digital signal of the pixel signal by using the correction value in the first drive mode.

15. The imaging device according to claim 14, wherein the test signal generation circuit supplies a clip voltage that clips the pixel signal to the column signal line in the first drive mode.

16. The imaging device according to claim 14,
wherein in the second drive mode, the test signal generation circuit outputs a first test signal and a second test signal that is larger than the first test signal,
wherein in the second drive mode, each of the column circuits outputs a first digital signal based on a result of comparison between the first reference signal and the first test signal, a second digital signal based on a result of comparison between the second reference signal and the first test signal, a third digital signal based on a result of comparison between the first reference signal and the second test signal, and a fourth digital signal based on a result of comparison between the second reference signal and the second test signal,
wherein the signal processing circuit acquires a correction value $\beta=(DS1-DN1)/(G \times DS2-DN2))$, where a ratio between a voltage change per unit time of the first reference signal and a voltage change per unit time of the second reference signal is denoted as G, the first digital signal is denoted as DN1, the second digital signal is denoted as DN2, the third digital signal is denoted as DS1, and the fourth digital signal is denoted as DS2, and
wherein in the first drive mode, each of the column circuits outputs a fifth digital signal based on a result of comparison between the second reference signal and the pixel signal, and the signal processing circuit multiplies the fifth digital signal by the ratio G and the correction value $\beta$.

17. The imaging device according to claim 16, wherein the signal processing circuit calculates the correction value $\beta$ by using respective average values of the first digital signal, the second digital signal, the third digital signal, and the fourth digital signal on a plurality of columns.

18. The imaging device according to claim 16, wherein the signal processing circuit calculates the correction value $\beta$ by using respective average values of the first digital signal, the second digital signal, the third digital signal, and the fourth digital signal of a plurality of frames.

19. A drive method of an imaging device comprising
a pixel unit including a plurality of pixels that are arranged in a matrix and each output a pixel signal in accordance with a received light amount,
a reference signal circuit that outputs a first reference signal and a second reference signal, wherein voltages of the first and second reference signals respectively change in dependent on time and a voltage change per unit time of the first reference signal is different from a voltage change per unit time of the second reference signal, and a plurality of column circuits each of which is provided on a corresponding column signal line of the pixel unit and includes a selector circuit that selects either the first reference signal or the second reference signal and a comparator that outputs a comparison signal indicating a result of comparison between the pixel signal and a reference signal selected by the selector circuit, wherein the plurality of column circuits include a first column circuit that operates in a first drive mode and a second column circuit that is driven by a smaller current than a current of the first column circuit, the drive method comprising:

at the column circuits, operating selectively in the first drive mode to output the comparison signal or a second drive mode to acquire a correction value of a ratio between the voltage change per unit time of the first reference signal and the voltage change per unit time of the second reference signal; and at the selector circuit of the second column circuit, selecting the same reference signal out of the first reference signal and the second reference signal in the first drive mode and the second drive mode.

20. An imaging system comprising:

an imaging device; and a signal processing device that processes a pixel signal output from the imaging device, wherein the imaging device includes a pixel unit including a plurality of pixels that are arranged in a matrix and each output a pixel signal in accordance with a received light amount;

a reference signal circuit that outputs a first reference signal and a second reference signal, wherein voltages of the first and second reference signals respectively change in dependent on time and a voltage change per unit time of the first reference signal is different from a voltage change per unit time of the second reference signal; and a plurality of column circuits each of which is provided on a corresponding column signal line of the pixel unit and includes a selector circuit that selects either the first reference signal or the second reference signal and a comparator that outputs a comparison signal indicating a result of comparison between the pixel signal and a reference signal selected by the selector circuit, wherein the column circuits operate selectively in a first drive mode to output the comparison signal or a second drive mode to acquire a correction value of a ratio between the voltage change per unit time of the first reference signal and the voltage change per unit time of the second reference signal, wherein the plurality of column circuits include a first column circuit that operates in the first drive mode and a second column circuit that is driven by a smaller current than a current of the first column circuit, and wherein the selector circuit of the second column circuit selects the same reference signal out of the first reference signal and the second reference signal in the first drive mode and the second drive mode.

21. The imaging system according to claim 20, wherein each of the pixels includes a plurality of photoelectric conversion units, and wherein the signal processing device processes the image signal generated in each of the plurality of photoelectric conversion units and acquires distance information on a distance from the imaging device to an object.

* * * * *